United States Patent
Chandolu et al.

(10) Patent No.: US 11,444,099 B2
(45) Date of Patent: Sep. 13, 2022

(54) MICROELECTRONIC DEVICES WITH LOWER RECESSED CONDUCTIVE STRUCTURES AND RELATED SYSTEMS

(71) Applicant: Micron Technology, Inc., Boise, ID (US)

(72) Inventors: Anilkumar Chandolu, Boise, ID (US); Indra V. Chary, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 16/922,792

(22) Filed: Jul. 7, 2020

(65) Prior Publication Data
US 2022/0013534 A1    Jan. 13, 2022

(51) Int. Cl.
| | |
|---|---|
| *H01L 27/11582* | (2017.01) |
| *H01L 27/11556* | (2017.01) |
| *H01L 27/11519* | (2017.01) |
| *H01L 27/1157* | (2017.01) |
| *H01L 27/11565* | (2017.01) |
| *H01L 27/11524* | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
None
See application file for complete search history.

(56) References Cited

U.S. PATENT DOCUMENTS

| | | | |
|---|---|---|---|
| 9,449,982 B2 | 9/2016 | Lu et al. | |
| 10,580,795 B1 | 3/2020 | Luo et al. | |
| 2015/0348984 A1 | 12/2015 | Yada et al. | |
| 2016/0204117 A1 | 7/2016 | Liu et al. | |
| 2020/0020713 A1* | 1/2020 | Choi | H01L 27/1157 |
| 2020/0119038 A1 | 4/2020 | Hopkins et al. | |

FOREIGN PATENT DOCUMENTS

| | | |
|---|---|---|
| WO | 2015/038427 A1 | 3/2015 |
| WO | 2020/081147 A1 | 4/2020 |

* cited by examiner

*Primary Examiner* — Hsien Ming Lee
(74) *Attorney, Agent, or Firm* — TraskBritt

(57) ABSTRACT

Microelectronic devices include a stack structure with a vertically alternating sequence of insulative structures and conductive structures arranged in tiers. Conductive contact structures extend through the stack structure. An insulative material is between the conductive contact structures and the tiers of the stack structure. In a lower tier portion of the stack structure, a conductive structure, of the conductive structures, has a portion extending a first width between a pair of the conductive contact structures. In a portion of the stack structure above the lower tier portion, an additional conductive structure, of the conductive structures, has an additional portion extending a second width between the pair of the conductive contact structures. The second width is greater than the first width. Related methods and electronic systems are also disclosed.

16 Claims, 23 Drawing Sheets

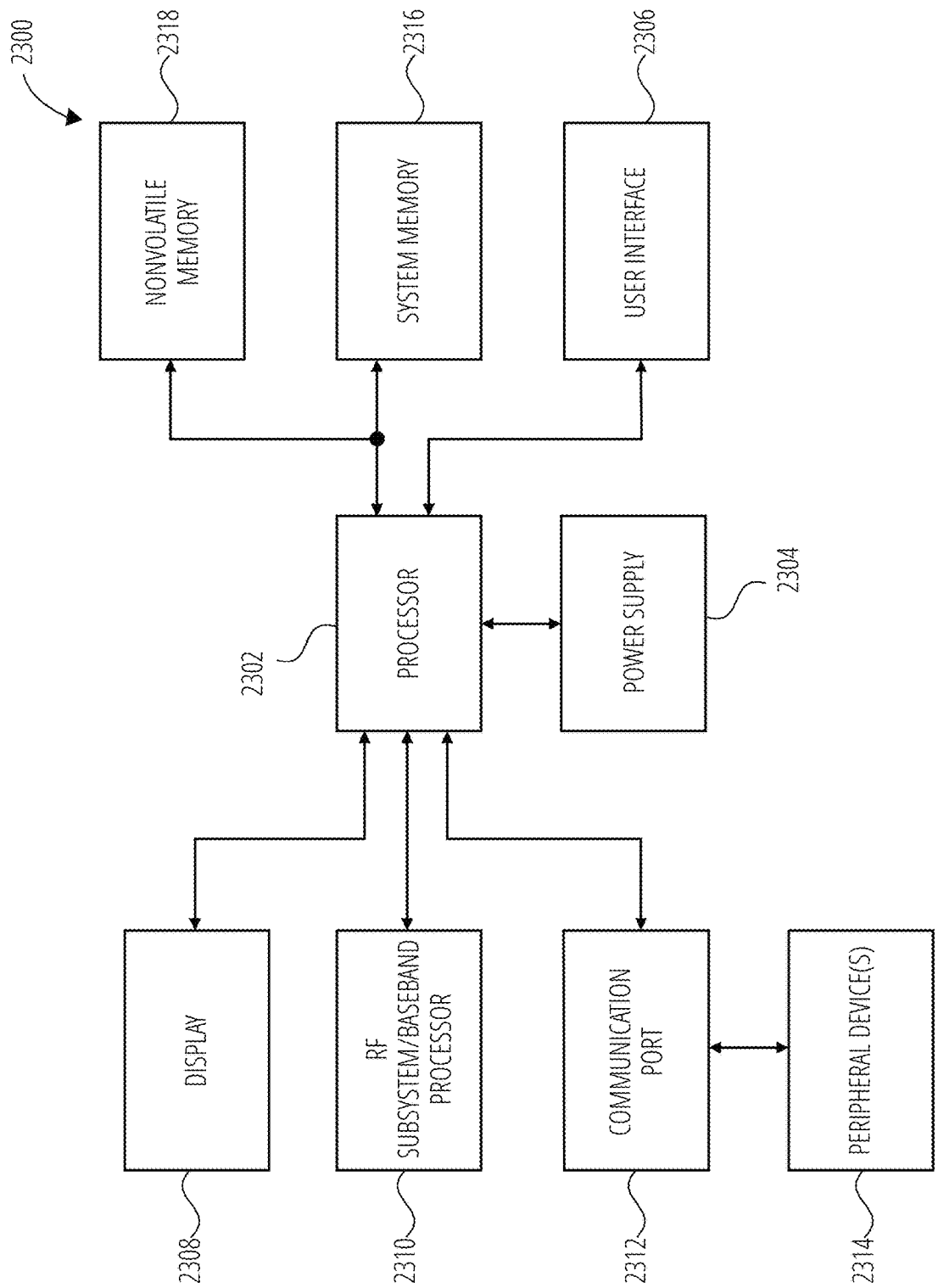

MICROELECTRONIC DEVICES WITH LOWER RECESSED CONDUCTIVE STRUCTURES AND RELATED SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

To form some 3D NAND memory devices, the stack of tiers is initially formed as an alternating structure of insulating materials and sacrificial materials, which sacrificial materials are subsequently removed and replaced with the conductive materials. Retaining the structural integrity of the insulating materials during the removal of the sacrificial materials and replacement of the conductive materials presents challenges.

BRIEF DESCRIPTION OF THE DRAWINGS

FIG. 23 is a block diagram of a processor-based system, in accordance with embodiments of the disclosure.

DETAILED DESCRIPTION

Figure 1:
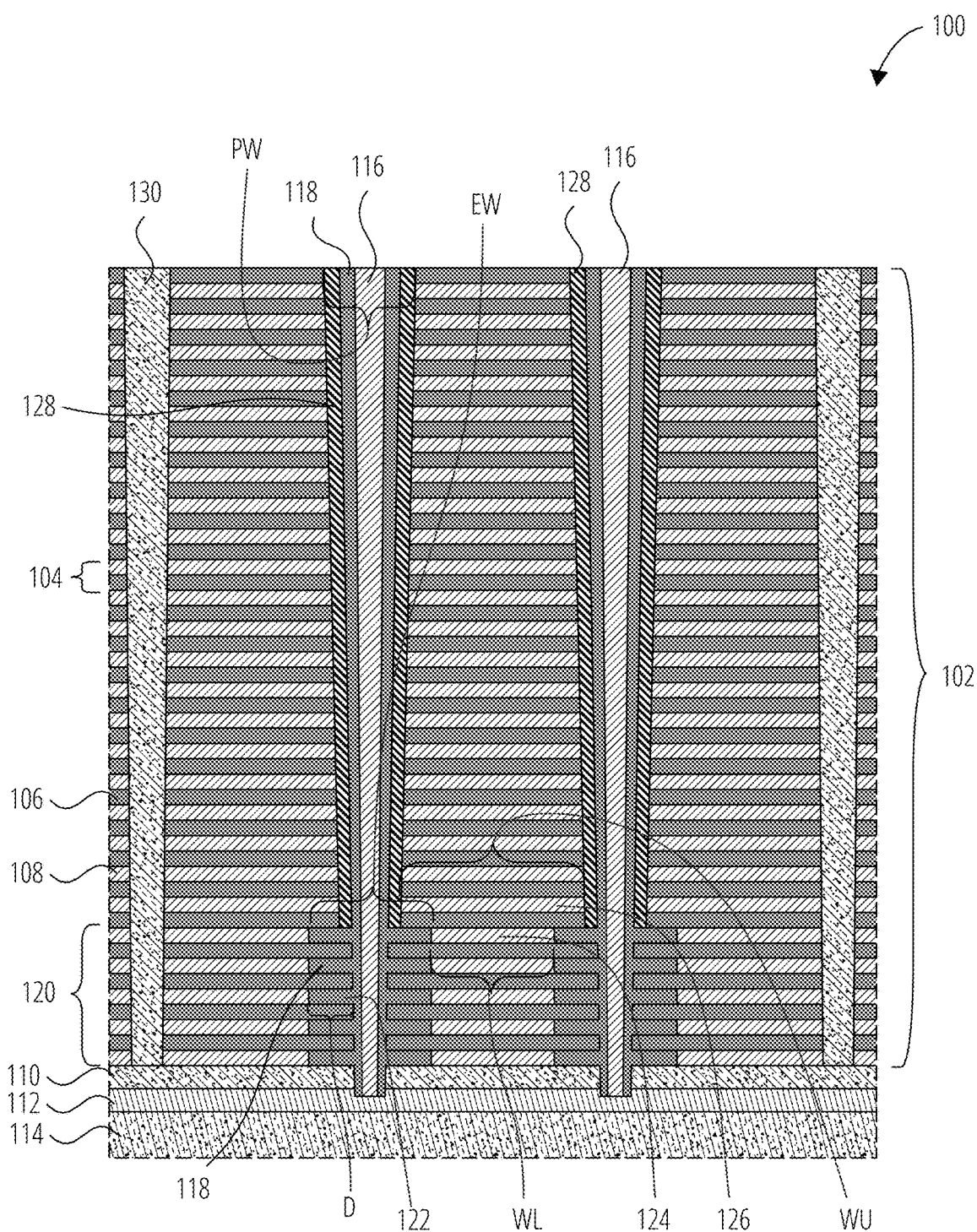
FIG. 1 is a cross-sectional, elevational, schematic illustration of a microelectronic device structure, according to embodiments of the disclosure, with insulative extensions adjacent the base of contact structures.
Figure 2:
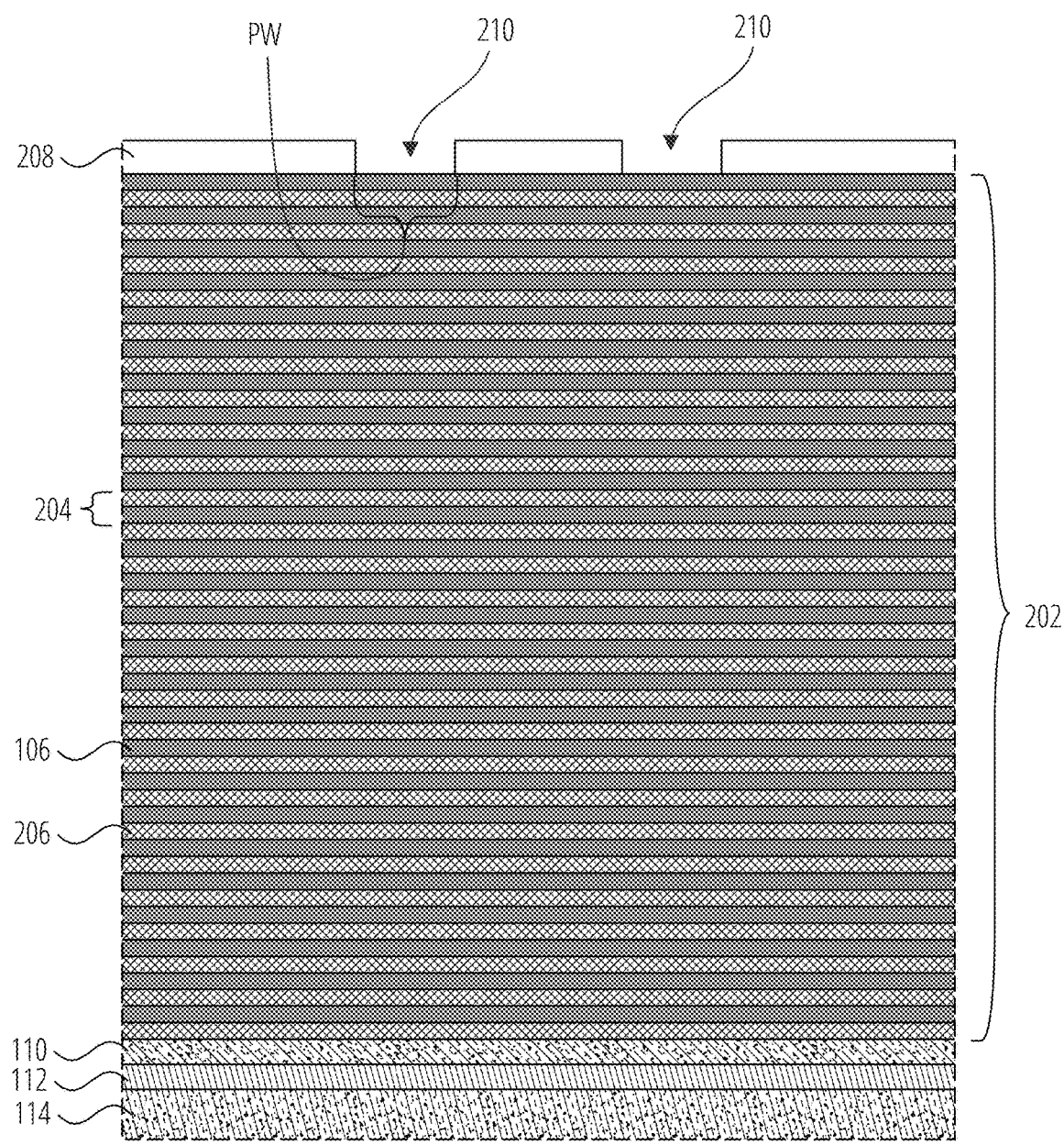
FIG. 2 through FIG. 11, in conjunction with FIG. 1, are cross-sectional, elevational, schematic illustrations during various stages of processing to fabricate the microelectronic device structure illustrated in FIG. 1, according to embodiments of the disclosure.
Figure 2:
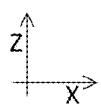

Structures (e.g., microelectronic device structures), apparatus (e.g., microelectronic devices), and systems (e.g., electronic systems), according to embodiments of the disclosure, include a stack of vertically alternating conductive structures and insulative structures in tiers. Conductive contact structures extend through the stack. An insulative material is adjacent the conductive contact structures, with extension of the insulative material adjacent the base of the conductive contact structures, e.g., at elevations of the stack occupied by the lower tiers of the stack. In forming the microelectronic device structures, the insulative extensions are formed prior to a replacement gate process in which are formed the conductive structures of the stack. In the replacement gate process, a sacrificial material is removed from between the insulative structures, leaving gaps between the insulative structures, and then the conductive material(s) of the conductive structures are formed in the gaps. While the gaps are present, the insulative structures are less physically supported from above and below, and the insulative structures form cantilevers or spans extending laterally outward from or between the insulative material that is adjacent the conductive contact structures. During this gap-including stage, the presence of the already-formed insulative extensions, in a lower tier portion, shortens the distance at which the insulative structures of such lower tier portion cantilever or span. Thus, these lower insulative structures may be less prone to bending, collapse, sagging, or other structural degradation that may otherwise result due to gravity or attraction forces. Accordingly, the replacement gate process may be more reliably completed, with the conductive structures formed in the gaps between the insulative structures.

As used herein, the term "opening" means a volume extending through at least one structure or at least one material, leaving a gap in that at least one structure or at least one material, or a volume extending between structures or materials, leaving a gap between the structures or materials.

Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is (are) not necessarily in contact with an atmosphere or non-solid environment. Structure(s) or material(s) "exposed" within an opening may be adjacent or in contact with other structure(s) or material(s) that is (are) disposed within the opening.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis.

As used herein, the terms "vertical" or "longitudinal" mean and include a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis and may be perpendicular to an indicated "X" axis.

As used herein, the term "width" means and includes a dimension, along a horizontal plane (e.g., at a certain elevation, if identified), defining a maximum distance, along such plane, of the material or structure in question. For example, a "width" of a structure, that is at least partially hollow, is the horizontal dimension between outermost edges or sidewalls of the structure, such as an outer diameter for a hollow, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, or feature in comparison to the parameter, property, or condition of another such structure, material, or feature— means and includes the parameter, property, or condition of the two such structures, materials, or features being equal, substantially equal, or about equal, at least in terms of respective portions of such structures, materials, or features. For example, two structures having "consistent" thicknesses as one another may each define a same, substantially same, or about the same thickness at X lateral distance from a feature, despite the two structures being at different elevations along the feature.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

FIG. 1 illustrates a microelectronic device structure 100 (e.g., a memory device structure, such as a 3D NAND memory device structure), according to embodiments of the disclosure, for an apparatus (e.g., a memory device, such as a 3D NAND memory device), which may be included in a system. The microelectronic device structure 100 includes a stack structure 102 having tiers 104, with vertically alternating insulative structures 106 and conductive structures 108.

Below the stack structure 102, one or more substrate or other base materials, support the stack structure 102. For example, the stack structure 102 may be above a polysilicon structure 110, which may be above a conductive base structure 112 (e.g., comprising one or more conductive material(s), such as tungsten silicide), which may be above an additional base structure 114.

Conductive contacts 116 (e.g., support contacts, electrical contacts to underlying electrical components (e.g., CMOS (complementary metal-oxide-semiconductor) circuitry)) extend through the height of the stack structure 102, through the polysilicon structure 110, and into the conductive base structure 112. At least one insulative material 118 may be laterally adjacent (e.g., may laterally surround) the contacts 116, and the insulative material 118 may also extend through the height of the stack structure 102, through the polysilicon structure 110, and into the conductive base structure 112.

In a lower tier portion 120 (e.g., lower vertical region) of the stack structure 102, the insulative material 118 extends laterally outward, away from the contacts 116, forming insulative extensions 122 that vertically alternate with ends of the insulative structures 106 of the lower tier portion 120. Accordingly, portions of the conductive structures 108 within the lower tier portion 120 (e.g., the portions of the conductive structures 108 laterally adjacent the insulative extensions 122, between neighboring contacts 116 of a pair of the contacts 116)—such as lower conductive structure portion 124—are of a shorter width WL than a width WU of at least some portions of the conductive structures 108 in the portion of the stack above the lower tier portion 120—such as upper conductive structure portion 126. Due to tapering of adjacent material(s), as described further below, the "width" of a particular one of the portions of the conductive structures 108 above the lower tier portion 120, such as the upper conductive structure portion 126, may be its width along its uppermost surface, its width along its midline, or its width along its lowermost surface, or an average thereof.

In some embodiments, the lower tier portion 120 consists of the lowest about 5% to about 20% of the total quantity (e.g., total number) of tiers 104 of the stack structure 102. For example, in embodiments in which the stack structure 102 consists of two-hundred tiers 104, the lower tier portion 120 may consist of about a lowest ten of the tiers 104 to about a lowest forty of the tiers 104. The particular quantity (e.g., number) of tiers 104 included in the lower tier portion 120 may be selected or otherwise tailored to be such quantity that may be most prone to bending, collapse, sagging, or other structural degradation in the absence of the insulative extensions 122.

The contacts 116 may taper in transverse cross-sectional width (e.g., outer diameter) through the height of the stack structure 102, from broadest width at the top of the stack structure 102, to narrowest width in the conductive base structure 112. The insulative material 118 may also taper in transverse cross-sectional width (e.g., outer diameter) through a portion of the height of the stack structure, from broadest width at the top of the stack structure 102, to narrowest width immediately above the lower tier portion 120, before expanding to width EW (e.g., outer diameter) of the insulative extensions 122 in the lower tier portion 120. The width EW of the insulative extensions 122 may be greater than the broadest width of the insulative material 118 at the top of the stack structure 102.

In some embodiments, such as the embodiment illustrated in FIG. 1, a liner 128 may be laterally adjacent (e.g., may laterally surround) the insulative material 118 in the portion of the stack structure 102 that is above the lower tier portion 120. The liner 128, may also taper in transverse cross-sectional width (e.g., outer diameter) from a broadest width (e.g., width PW) at the top of the stack structure 102, to a narrowest width immediately above the lower tier portion 120. The liner 128 may be absent from the lower tier portion 120.

Fill material structures 130 (e.g., regions of fill material, such as a polysilicon fill material) extend through the stack structure 102, dividing the stack structure 102 into blocks, with one or more of the contacts 116 within a single block. The fill material structures 130 may also taper in transverse cross-sectional width (e.g., outer diameter) from a broadest width at the top of the stack structure 102 to a narrowest width at or below the bottom of the stack structure 102. Due to the presence of the insulative extensions 122 in the lower tier portion 120, portions of the conductive structures 108 (e.g., portions within the lower tier portion 120 and between one of the contacts 116 and a neighboring one of the fill material structures 130) are also of a shorter width than a width of corresponding portions (e.g., portions vertically above the lower tier portion and between the same one of the contacts 116 and the same neighboring one of the fill material structures 130) of at least one of the conductive structures 108 in the portion of the stack above the lower tier portion 120.

In any of the aforementioned tapering materials or structures, the slope of the respective taper may be, at least in some embodiments, substantially smooth, without recesses, extensions, steps, or other interruptions in the sidewall that would otherwise define sharp changes in slope. For example, an outer sidewall of the insulative material 118 may be substantially smooth until the insulative material 118 extends to define the insulative extensions 122.

Insulative material(s) of the insulative structures 106 and/or the insulative material 118 include at least one electrically insulative material (e.g., a dielectric oxide material, such as silicon dioxide; air). The insulative material(s) of the insulative structures 106 may be the same or different than the insulative material 118. In embodiments in which the insulative material 118 (and therefore the insulative extensions 122) and the insulative structures 106 are formed of and include the same material, the insulative structures 106 and the insulative extensions 122 may not be visually distinguishable in the microelectronic device structure 100. The liner 128, if present, may also include one or more of the aforementioned insulative material(s), which may be the same or different than the insulative material(s) of the insulative structures 106 and/or of the insulative material 118.

The conductive material(s) of the conductive structures 108 may include one or more conductive materials in one or more material regions. In some embodiments, the conductive structures 108 include a conductive material (e.g., a metal, such as tungsten) within an additional conductive material (e.g., a conductive liner, such as tungsten nitride), the additional conductive material being disposed along portions of the conductive structures 108 adjoining insulative structures 106 or other features of the microelectronic device structure 100, such as adjoining the insulative material 118 adjacent the contacts 116.

In some embodiments, the stack structure 102 of the microelectronic device structure 100 illustrated in FIG. 1 may represent one deck (e.g., a lowest deck) of a device structure that includes multiple decks, each deck including a stack of tiers of vertically alternating conductive structures and insulative structures. One or more of such additional stacks may be structured as the stack structure 102 of FIG. 1, including insulative extensions 122 adjacent the base of contacts 116 (e.g., along the lower tier portion 120). Each such stack structure 102 may provide a "deck" of the microelectronic device structure 100. Accordingly, relative terms used in describing the materials of structures of the stack structure 102 (or other stack structures) of this disclosure are not necessarily relative to another stack structure of a multi-deck microelectronic device structure. For example, a "broadest" width of a material, when describing what is illustrated in FIG. 1, is at least the broadest width of such material with respect to such visible portion of such material in the structure and/or device, and may or may not be the "broadest" width of such material with respect to all portions of such material in the structure and/or device overall.

Accordingly, disclosed is a microelectronic device comprising a stack structure having a vertically alternating sequence of insulative structures and conductive structures arranged in tiers. Conductive contact structures extend through the stack structure. An insulative material is between the conductive contact structures and the tiers of the stack structure. In a lower tier portion of the stack structure, a conductive structure (of the conductive structures) has a portion extending a first width between a pair of the conductive contact structures. In a portion of the stack structure above the lower tier portion, an additional conductive structure (of the conductive structures) has an additional portion extending a second width between the pair of the conductive contact structures. The second width is greater than the first width.

Also disclosed is a microelectronic device comprising a stack structure comprising a vertically alternating sequence of insulative structures and conductive structures arranged in tiers. Contacts extend through the stack structure. An insulative material is adjacent the contacts and extends through the stack structure. The insulative material includes insulative extensions partially horizontally extending across and vertically alternating with the insulative structures within a lower vertical region of the stack structure.

Microelectronic device structures, such as the microelectronic device structure 100 of FIG. 1, may be formed by fabrication methods in which contact openings are formed— e.g., etched according to a pattern defined in a hardmask— through tiers of a stack structure of the insulative structures 106 interleaved with sacrificial structures, and then the sacrificial structures are recessed along the base of contact openings in the lower tier portion 120. This recessing effectively widens the base of the contact openings adjacent the sacrificial structures, without necessitating widening of the dimension of the patterned openings in the hardmask. The recesses are then filled with the insulative material 118, forming the insulative extensions 122, prior to a process of replacing the remaining sacrificial material with conductive material(s) to form the conductive structures 108. By recessing the sacrificial structures and filling the insulative material 118, the insulative structures 106 in the lower tier portion 120 include shorter (e.g., less-wide) cantilever or span portions, as a result of removing the sacrificial structures 206, which shorter cantilever or span portions are less prone to bending, collapse, sagging, or other structural degradations during the formation of the conductive structures 108. Avoiding such structural degradations also enables formation of the conductive structures 108 in a reliable manner.

Figure 9:
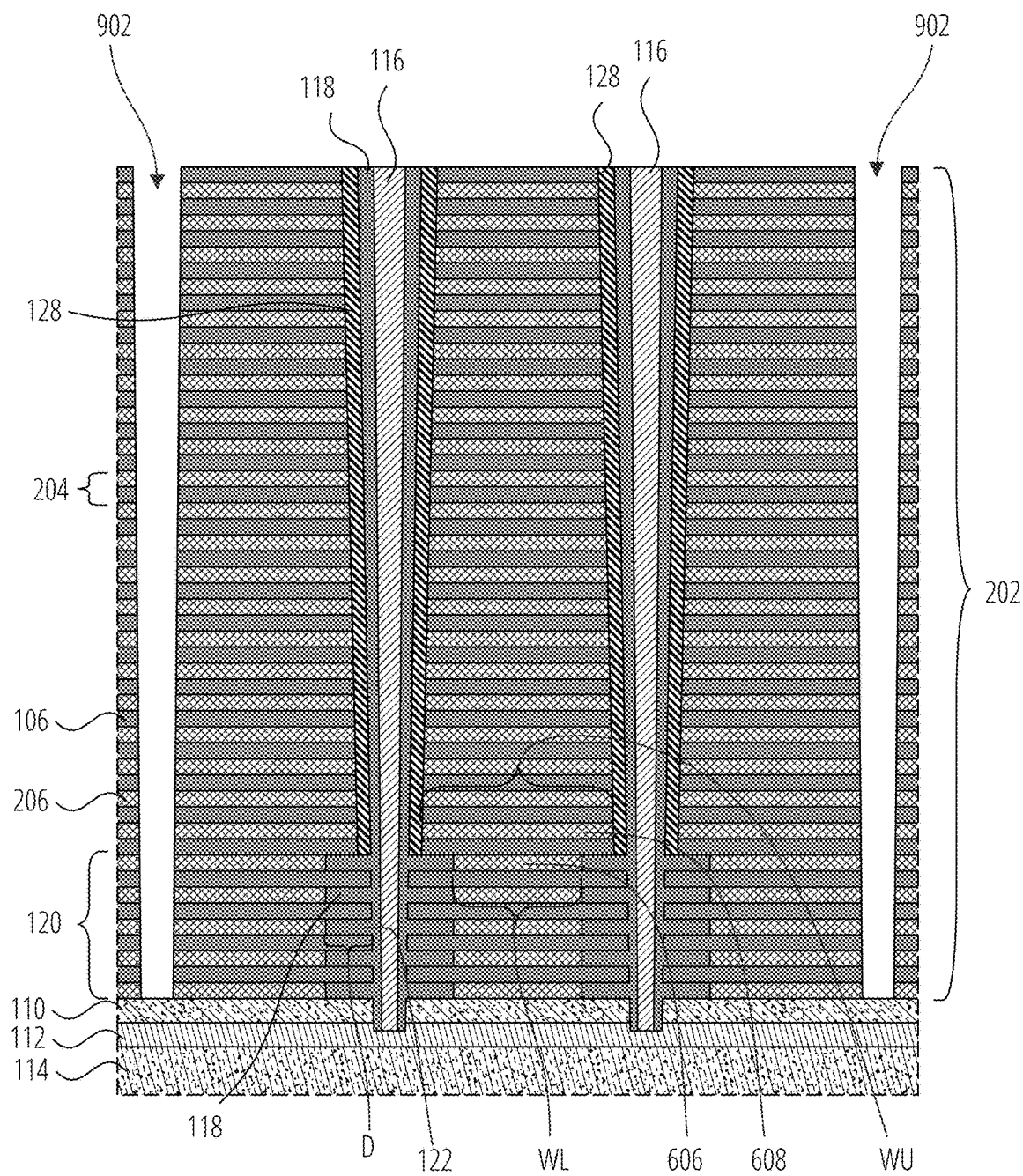
Figure 10:
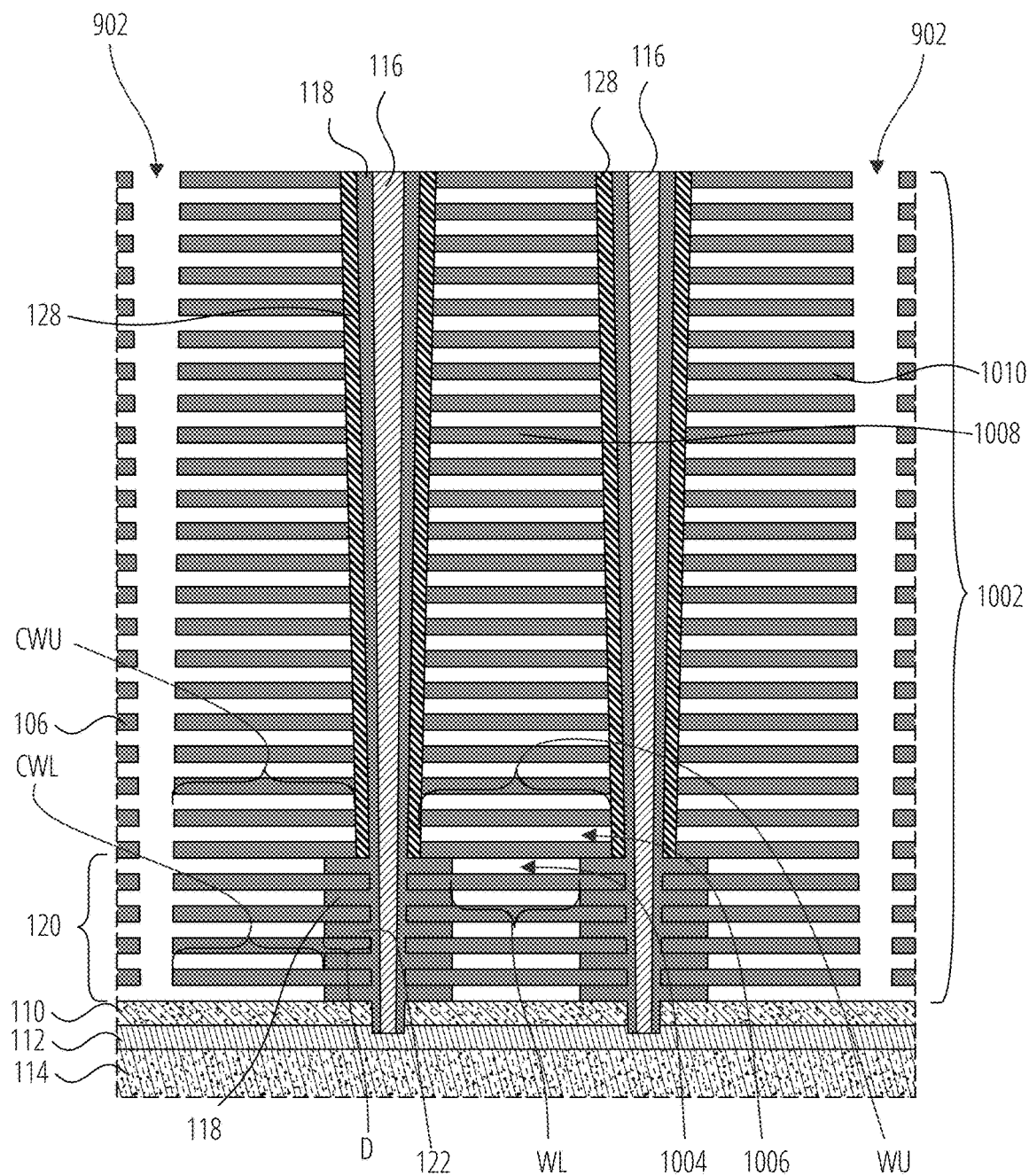
Figure 11:
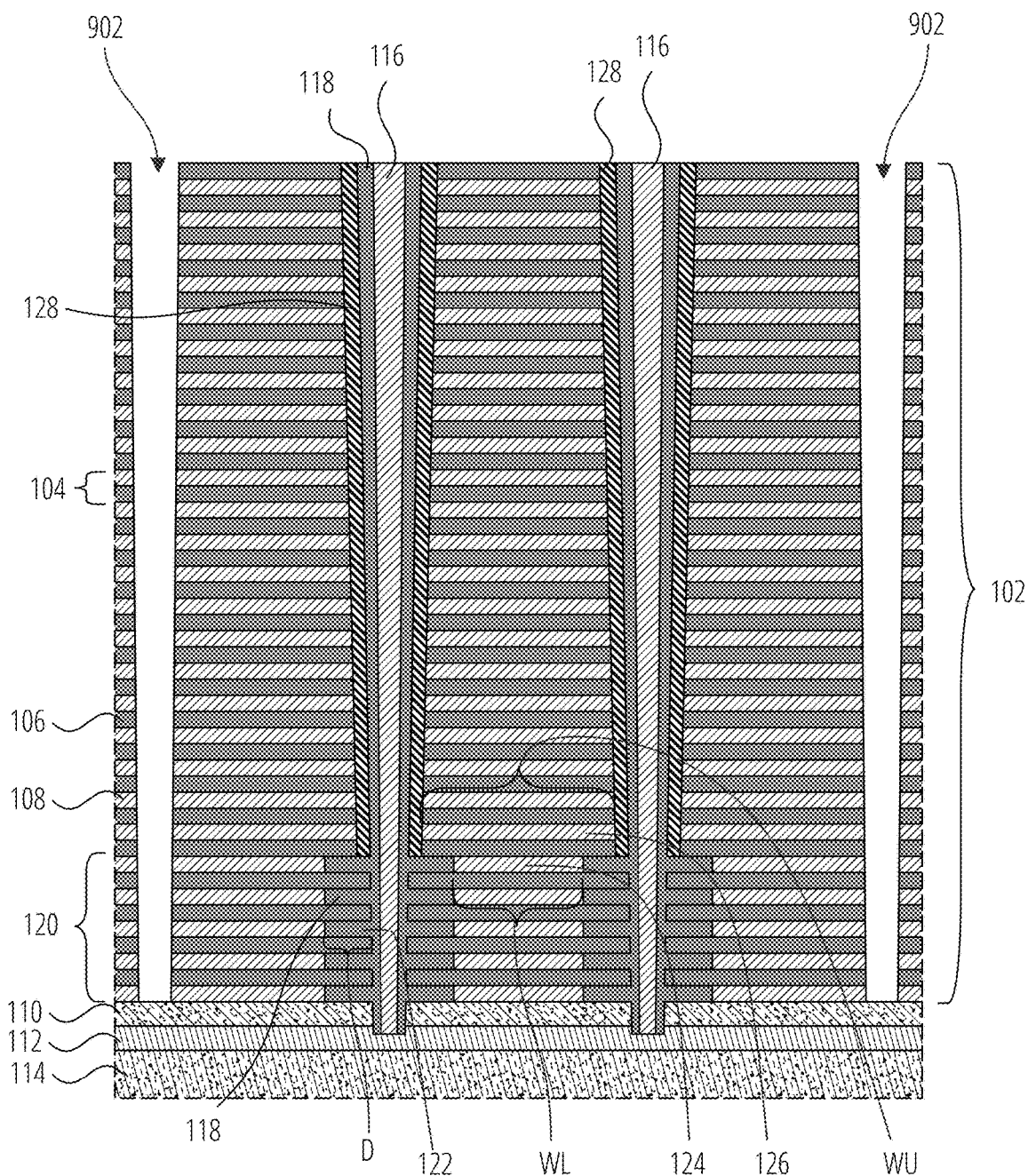

Various stages of a method of fabrication are illustrated in FIG. 2 to FIG. 11, as well as in FIG. 1, with FIG. 1 representing a method stage subsequent to that illustrated in FIG. 11. Methods of fabrication, according to embodiments of the disclosure, include forming a stack structure 202 with tiers 204 providing vertically alternating insulative structures 106 and sacrificial structures 206. The sacrificial structures 206 comprise at least one sacrificial material, such as a dielectric material differing in composition from the insulative material(s) of the insulative structures 106 (and from the insulative material 118 (FIG. 1) to be subsequently formed). For example, the at least one sacrificial material may comprise a dielectric nitride material, such as silicon nitride (e.g., in embodiments in which the insulative structures 106 comprise an oxide dielectric material, such as silicon dioxide).

Prior to forming the stack structure 202, the conductive base structure 112 may be formed (e.g., deposited) on the base structure 114, and the polysilicon structure 110 may be formed (e.g., deposited) on the conductive base structure 112. Then, the stack structure 202 may be formed by forming (e.g., depositing) the insulative material(s) of the insulative structures 106 and the sacrificial material(s) of the sacrificial structures 206 in sequence, one after the other, from lower elevations to upper elevations, above the polysilicon structure 110, the conductive base structure 112, and the base structure 114.

A hardmask 208 may be formed (e.g., deposited) above the stack structure 202 and may define a pattern of pattern openings 210. Each of the pattern openings 210 defines a dimension (e.g., a pattern width PW) for a contact opening to be formed. The dimensions of the pattern openings 210 may be the same as one another, or they may vary from at least one of the pattern openings 210 to another.

Figure 3:
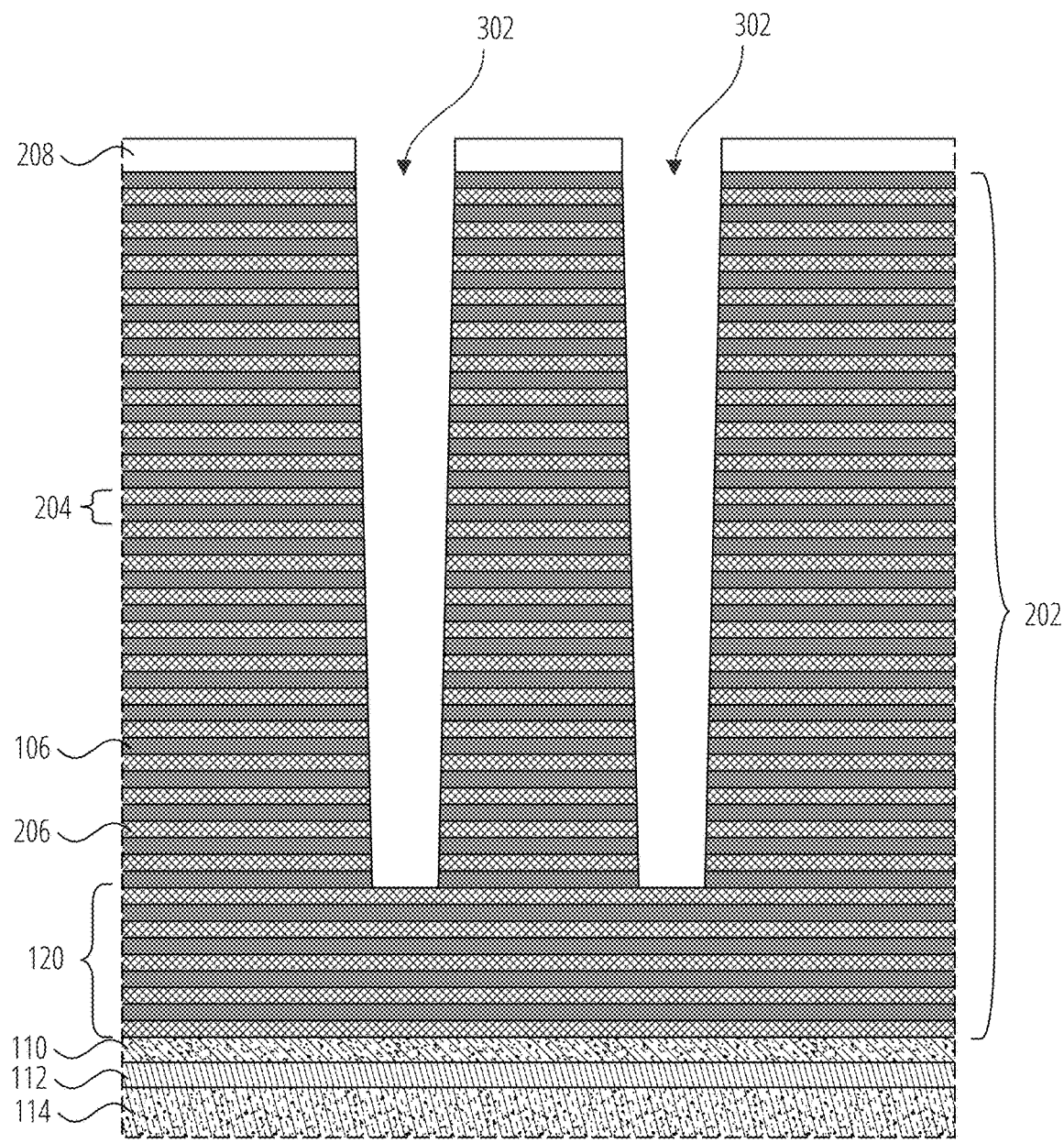

With reference to FIG. 3, openings 302 may then be formed (e.g., etched) to extend partially through the stack structure 202, to—but not through—the lower tier portion 120, depending upon the quantity of tiers 204 selected to be included in the lower tier portion 120, as discussed above. In some embodiments, the openings 302 may expose, at a base thereof, one of the insulative structures 106 at the top of the lower tier portion 120. In other embodiments, such as that illustrated in FIG. 3, the openings 302 may expose, at the base thereof, one of the sacrificial structures 206 at the top of the lower tier portion 120. The depth of the openings 302 may be tailored by tailoring the timing, etch chemistries, or other parameters of the material-removing process.

Figure 4:
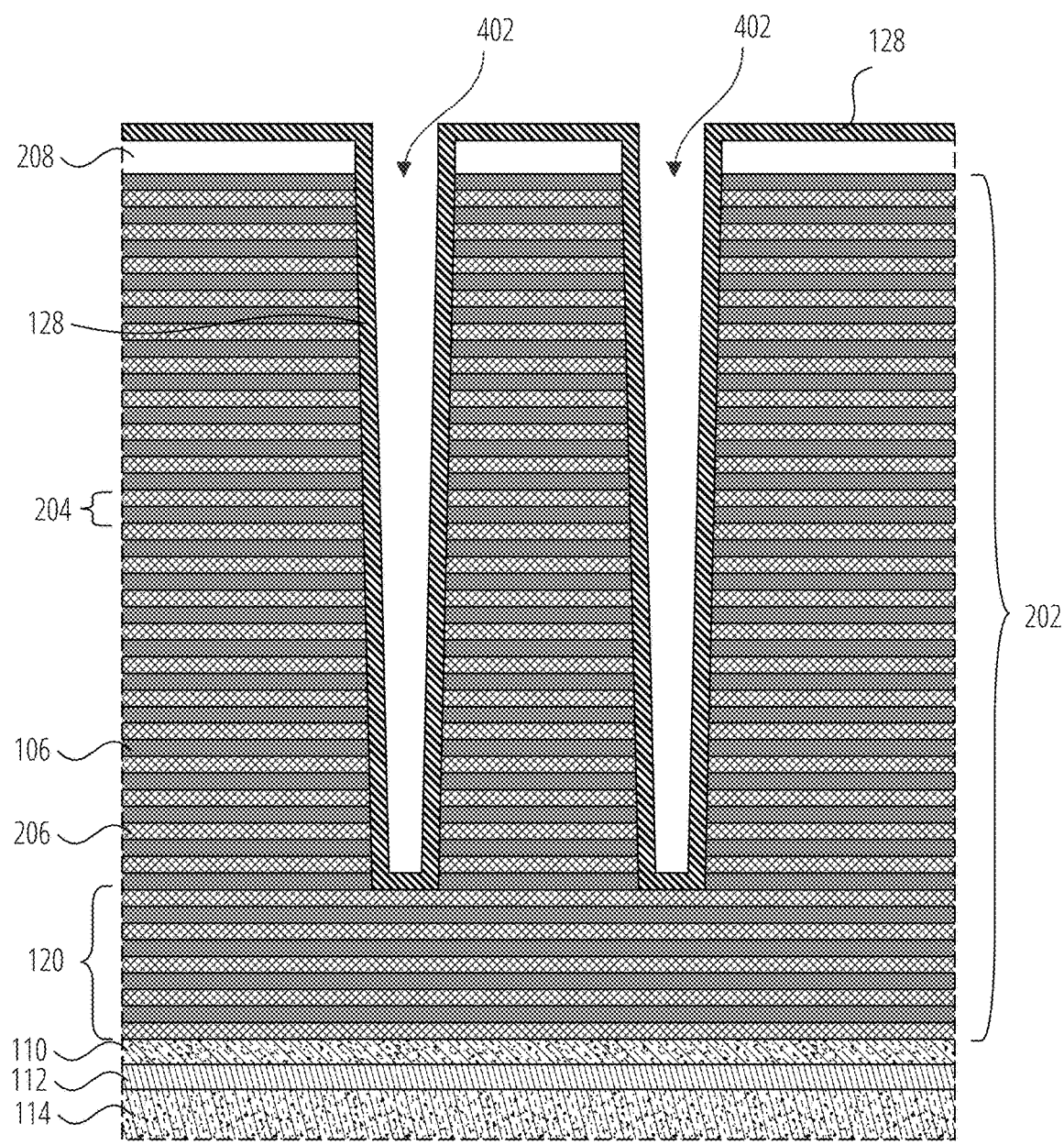

With reference to FIG. 4, a liner 128 may then be formed (e.g., deposited, conformally deposited such as by ALD) on at least the sidewalls that defined the opening 302 (FIG. 3). In some embodiments, the liner 128 may also be formed in the base of the openings 302, such as on the upper surface of the lower tier portion 120 that was exposed in the openings 302. In these or other embodiments, the liner 128 may also be formed on the exposed surfaces of the hardmask 208.

The liner 128 may be relatively thin, defining a thickness within a range of from about 4 nm to about 40 nm.

The liner 128 may be formed of and include a nonconductive material with a composition that differs at least in etch selectivity from the material(s) of the sacrificial structures 206 so that, subsequently, material(s) of the sacrificial structures 206 may be etched without fully removing the liner 128.

The liner 128 may be sacrificial or may be non-sacrificial. In embodiments in which the liner 128 is formulated to be non-sacrificial, such as in the embodiment of FIG. 2 through FIG. 11 and FIG. 1, the liner 128 may be formed of and include, e.g., insulative material(s) such as dielectric oxide material(s), such as silicon dioxide if the sacrificial structures 206 comprise silicon nitride or other material(s) with a greater etch selectivity than the silicon dioxide of the liner 128. In embodiments in which the liner 128 is formulated to be sacrificial, such as in embodiments discussed below, the liner 128 may be formed of and include, e.g., polysilicon, provided the sacrificial structures 206 comprise silicon nitride or other material(s) with a greater etch selectivity than the polysilicon of the liner 128.

Figure 5:
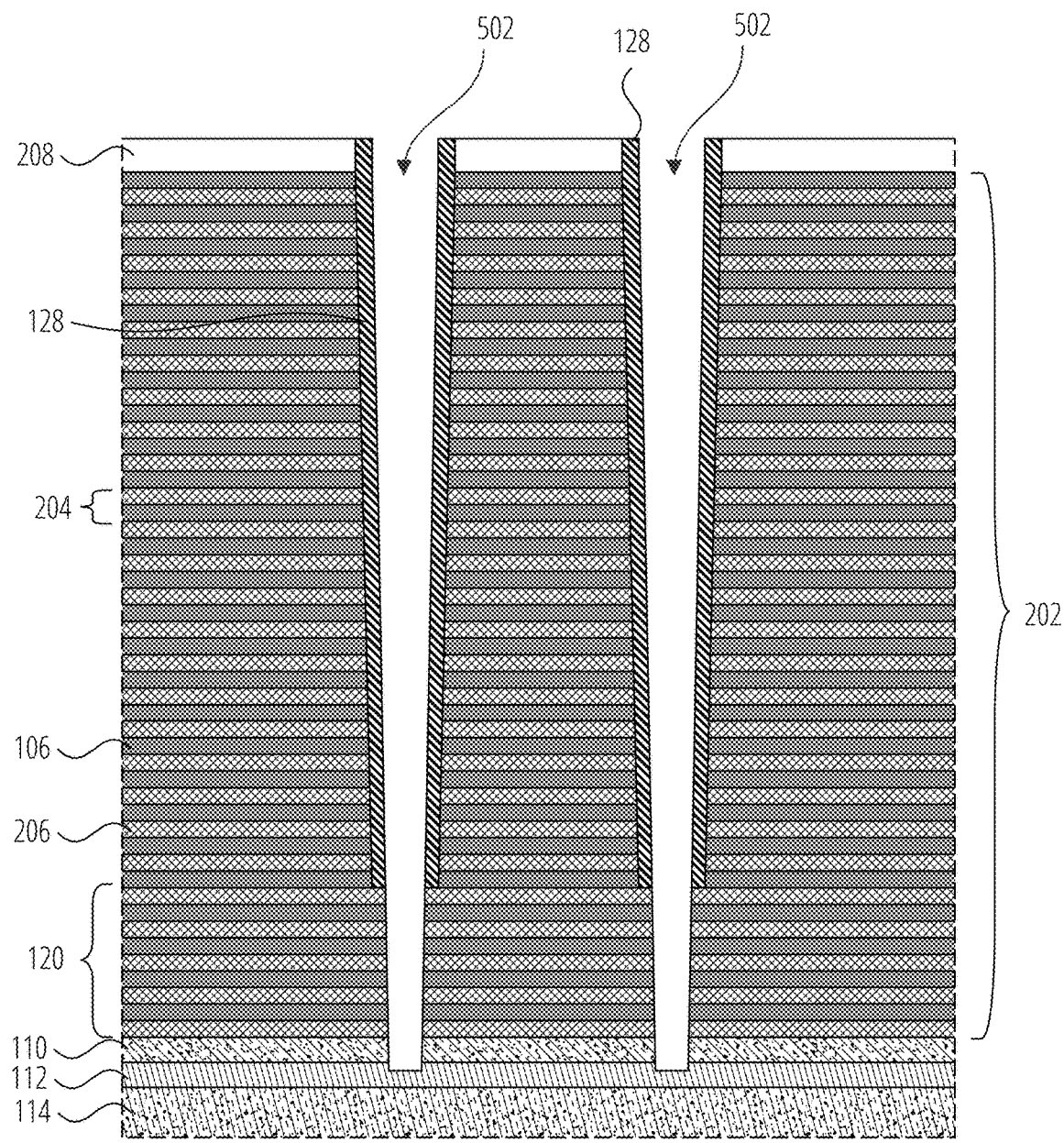

The lined openings 402 may then be extended, as illustrated in FIG. 5, to form extended openings 502. More particularly, select portions of the liner 128 may be removed (e.g., etched) while leaving in place the liner 128 on sidewalls along the extended openings 502 above the lower tier portion 120. For example, the portion of the liner 128 that covered the previously-exposed surface of the lower tier portion 120 and, optionally, portions of the liner 128 above the hardmask 208, may be removed. The remaining portions of the liner 128 may provide protection, during subsequent processing, to the stack structures 102 and the sacrificial structures 206 of tiers 204 above the lower tier portion 120.

Though one may ideally wish to form the extended opening 502 with perfectly vertical sidewalls through the stack structure 202, it is understood in the art that practical limitations on material-removal processes (e.g., etching processes) inherently result in more material removal in upper elevations of a stack structure (e.g., the stack structure 202) than at lower elevations. Thus, realistically, the extended openings 502 are likely to be exhibit a tapering width (e.g., horizontal dimension, transverse dimension) from a widest width at the top of the stack structure 202 (e.g., pattern width PW of FIG. 2) to a narrowest width at the base of the extended openings 502 (e.g., at the conductive base structure 112, below the lower tier portion 120). Likewise, the openings 302 of FIG. 3 may also have tapered, such that the liner 128 may taper in width (e.g., outer diameter) from the top of the stack structure 202 to its base just above the lower tier portion 120.

With such a taper, it should be noted that the insulative structures 106 and the sacrificial structures 206 widen with increasing depth, from the top of the stack structure 202. In other words, the width of the insulative structures 106 and the sacrificial structures 206 decrease with increasing elevation relative to the base structure 114. Therefore, in the lower tier portion 120, the insulative structures 106 are wider (e.g., longer in a horizontal dimension) than the insulative structures 106 above the lower tier portion 120. Were the material of the sacrificial structures 206 to be removed from the tiers 204 without further modification to the width of either the insulative structures 106 or the sacrificial structures 206, the insulative structures 106 in the lower tier portion 120 would include the longest cantilever and span portions, unsupported from above and below, and therefore most prone to bending, collapse, sagging, or other structural degradation upon removal of the material of the sacrificial structures 206. That is, shorter (e.g., narrow width) cantilever and span portions may be less prone to structural degradation than longer (e.g., wider) cantilever and span portions.

Figure 6:
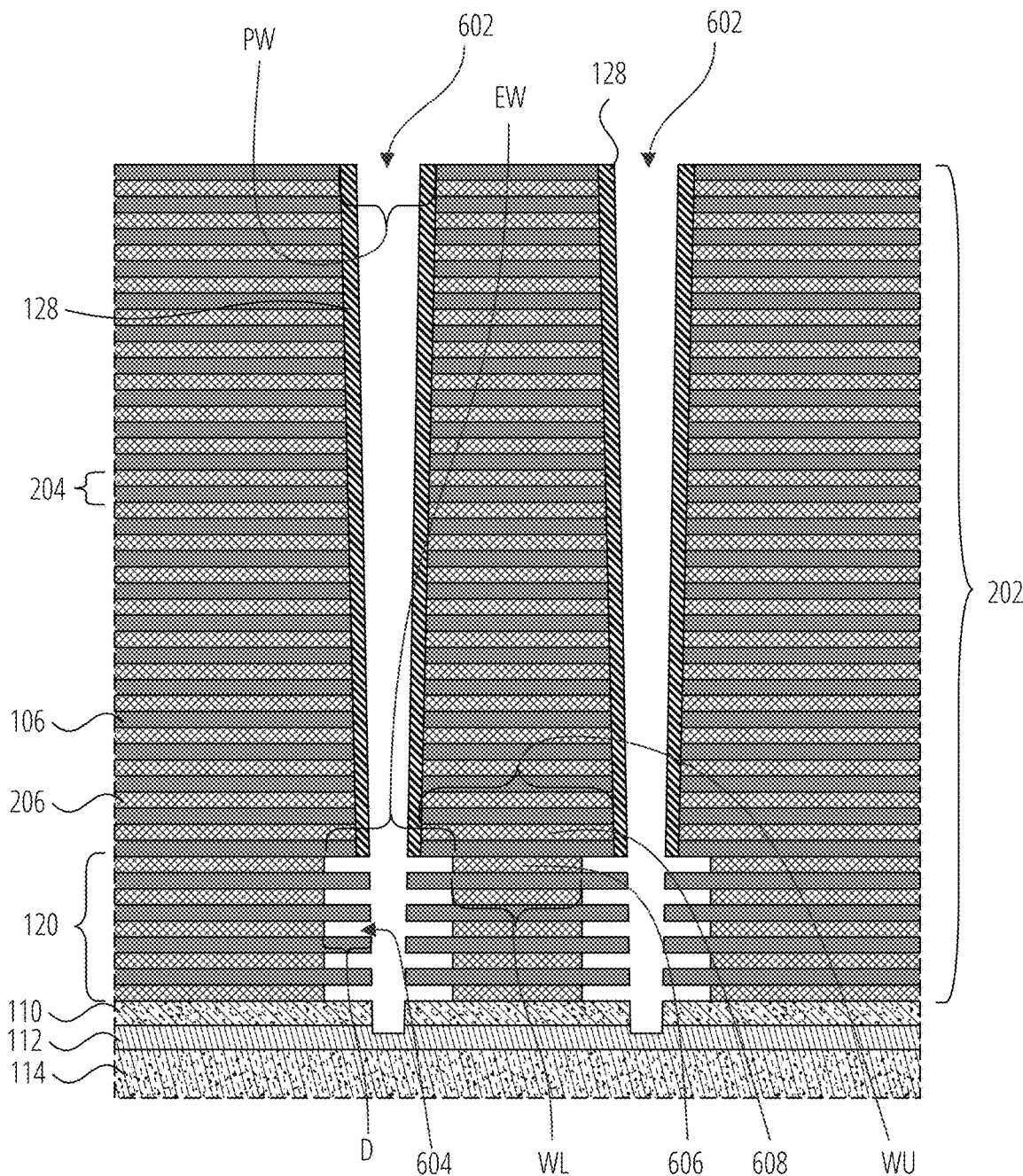

The hardmask 208 may then be removed (e.g., stripped), as illustrated in FIG. 6. Concurrently, before, or after, the sacrificial structures 206 within the lower tier portion 120 may be recessed. For example, portions of the sacrificial structures 206 bordering the extended openings 502 (FIG. 5) may be removed (e.g., etched, such as with a wet nitride etch chemistry), selectively relative to the insulative structures 106, to recess the sacrificial structures 206 a lateral distance D, e.g., about 50 nm to about 60 nm, relative to the opening-facing sidewall of a neighboring one of the insulative structures 106.

Recessing the sacrificial structures 206 effectively widens the base of the extended openings 502 (FIG. 5) at the elevations of the sacrificial structures 206 in the lower tier portion 120, forming lined base-widened openings 602 that include recesses 604 adjacent the sacrificial structures 206 of the lower tier portion 120. An extended width EW of the lined base-widened openings 602 (and therefore also of the recesses 604, e.g., an outer diameter of the recesses 604), in elevations of the sacrificial structures 206, equals twice lateral distance D plus the width that had previously been defined by the extended openings 502 (FIG. 5). Accordingly, in embodiments in which the sacrificial structures 206 are recessed a lateral distance D between about 50 nm to about 60 nm, each of the recesses 604 may have an outer diameter in the range of, e.g., between about 100 nm to about 120 nm plus the width that had previously been defined by the extended openings 502 (FIG. 5). In some embodiments, the extended width EW may also taper, decreasing with increasing depth toward the base structure 114 (e.g., decreasing with decreasing elevation relative to the base structure 114), though interrupted by the insulative structures 106, which may not be recessed. The extended width EW (e.g., at at least an elevation of an uppermost sacrificial structure 206 of the lower tier portion 120) may be wider than the patterned dimension PW used to form the initial openings 302 (FIG. 3).

Forming the recesses 604 shortens portions of the sacrificial structures 206 in the lower tier portion 120, such that a lower sacrificial structure portion 606 (e.g., a sacrificial structure 206 portion within the lower tier portion 120 and between a pair of neighboring lined base-widened openings 602) is shorter (e.g., less wide) than an upper sacrificial structure portion 608 (e.g., a sacrificial structure 206 portion adjacent but above the lower tier portion 120 and between the same pair of neighboring lined base-widened openings 602).

Figure 7:
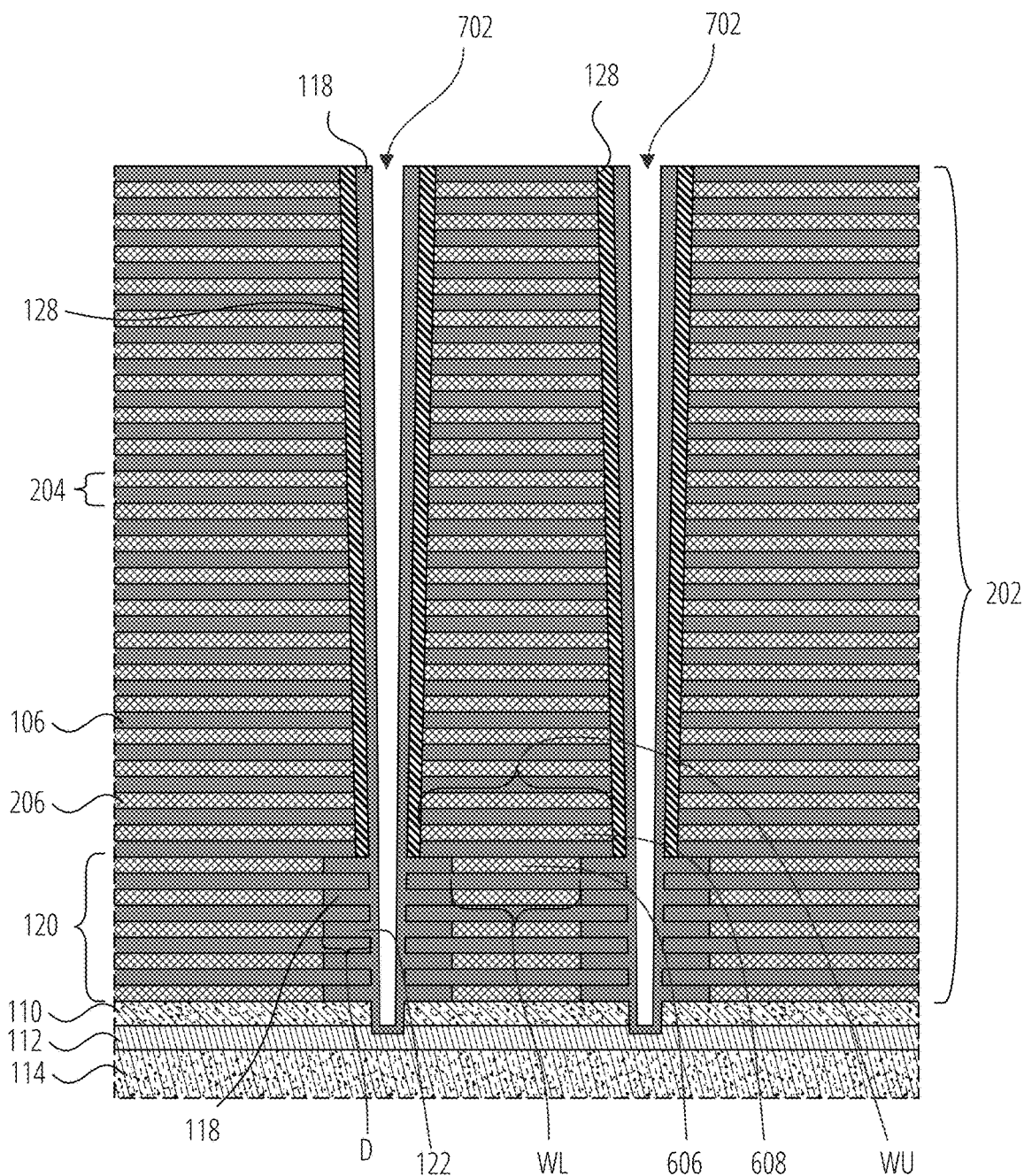

With reference to FIG. 7, the insulative material 118 may then be formed (e.g., deposited) to fill the recesses 604 (FIG. 6), forming the insulative extensions 122 adjacent the sacrificial structures 206 in the lower tier portion 120. The insulative material 118 is also formed on the liner 128. The insulative material 118 may be formed to define contact openings 702 that extend through the stack structure 202.

Figure 8:
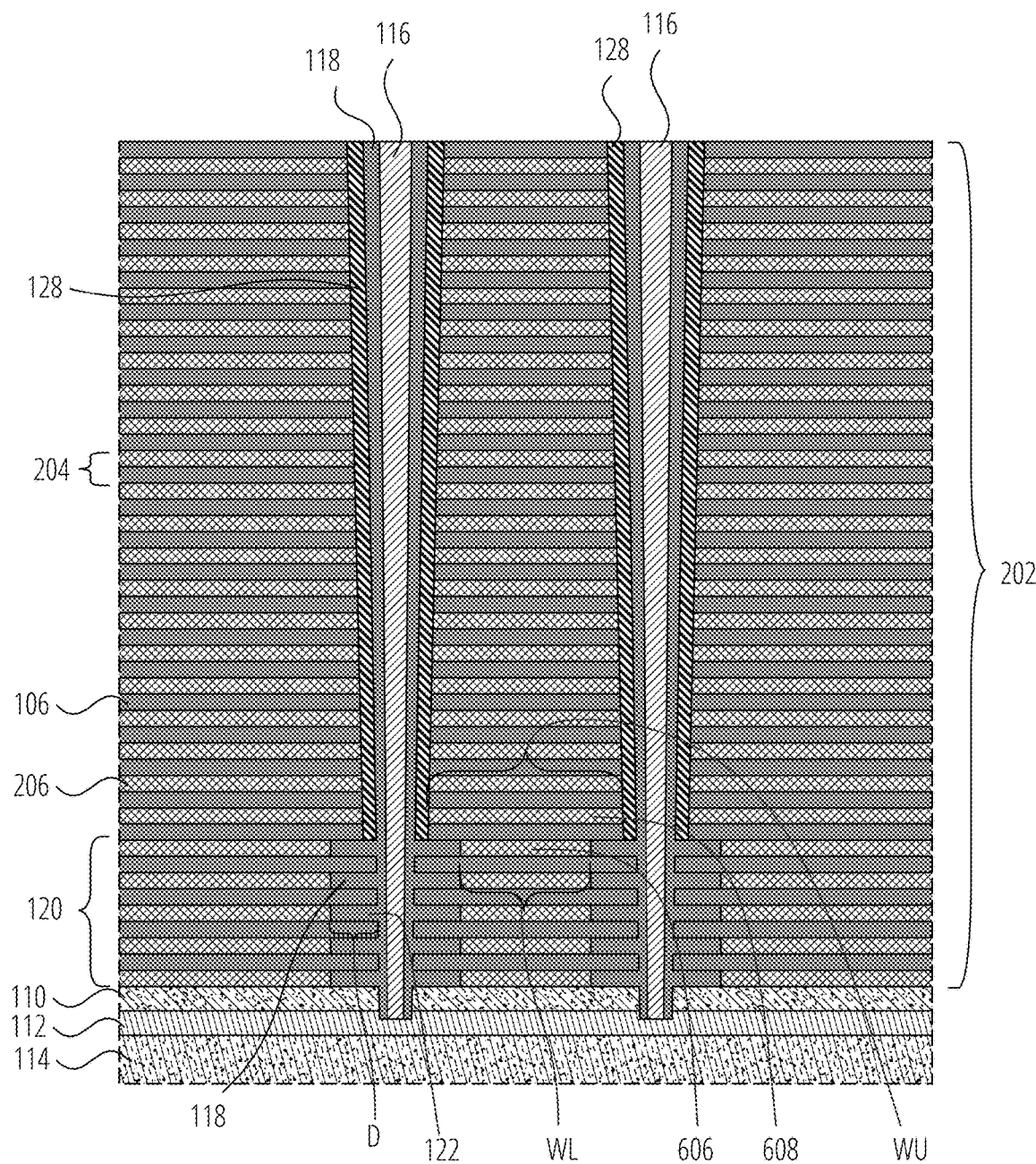

With reference to FIG. 8, a base portion of the insulative material 118 may then be removed (e.g., etched) to expose a surface of the conductive base structure 112 in the contact openings 702 (FIG. 7), and then the contacts 116 formed (e.g., by depositing the conductive material(s) of the contacts 116) in the contact openings 702.

With reference to FIG. 9, slits 902 may then be formed (e.g., etched) through the stack structure 202 to define block portions. As with the formation of the openings 302 of FIG. 3 and the extended openings 502 of FIG. 5, the slits 902 may also exhibit tapering through the elevations of the stack structure 202 due to practical limitations on material-removal processes (e.g., etching processes).

A replacement gate process is then performed to remove (e.g., exhume) the sacrificial material(s) of the sacrificial structures 206, as illustrated in FIG. 10, forming a stack structure 1002 consisting essentially of, or consisting of, the insulative structures 106 extending laterally from or between the insulative material 118 adjacent the contacts 116, with void space above and below. Due to the previous formation of the insulative extensions 122, a lower void 1004 formed by removing the sacrificial structures 206 (FIG. 9) from the lower tier portion 120 is less wide than an upper void 1006 formed by removing the sacrificial structures 206 (FIG. 9) from adjacent but above the lower tier portion 120.

The insulative structures 106 of the stack structure 1002 include span portions 1008 spanning between neighboring contacts 116 (e.g., laterally extending directly between insulative material 118 adjacent neighboring contacts 116). In the lower tier portion 120, the span portions 1008 extend between opposing insulative extensions 122. As a result of the previously-formed insulative extensions 122, a width WL of one of the span portions 1008 in the lower tier portion 120 of the stack structure 1002 is less than a width WU of one of the span portions 1008 above but adjacent the lower tier portion 120.

The insulative structures 106 of the stack structure 1002 also include cantilever portions 1010 laterally extending from one of the contacts 116 (e.g., laterally extending directly from the insulative material 118 adjacent one of the contacts 116) to one of the slits 902. In the lower tier portion 120, each of the cantilever portions 1010 extend from a respective one of the insulative extensions 122. As a result of the previously-formed insulative extensions 122, a width CWL of one of the cantilever portions 1010 in the lower tier portion 120 of the stack structure 1002 is less than a width CWU of one of the cantilever portions 1010 adjacent but above the lower tier portion 120 of the stack structure 1002.

Each span portion 1008 is substantially unsupported from above and below. Moreover, each cantilever portion 1010 is substantially unsupported from above, below, and along the lateral side boarding one of the slits 902. However, due to the relatively-shorter widths of the span portions 1008 and cantilever portions 1010 of the insulative structures 106 in the lower tier portion 120, these structures may be less prone to bending, collapse, sagging, or other structural degradation than they would be had they retained their wider widths (e.g., had the sacrificial structures 206 (FIG. 9) not been recessed and had the insulative extensions 122 not been formed prior to the removal of the sacrificial structures 206).

After the removal (e.g., exhumation) of the sacrificial material(s) of the sacrificial structures 206 (FIG. 9), the conductive material(s) of the conductive structures 108 (e.g., FIG. 1) may then be formed to fill the gaps (e.g., lower voids 1004 and upper voids 1006), as illustrated in FIG. 11. For example, a conductive liner (e.g., tungsten nitride) may be formed first, to line the insulative structures 106 and the insulative material 118 that was exposed by the gaps (e.g., lower voids 1004 and upper voids 1006 (FIG. 10)), and then a conductive material (e.g., tungsten) may be formed to fill remaining space of the gaps (e.g., remaining space of the lower voids 1004 and the upper voids 1006 (FIG. 10)). Methods for forming such conductive structures 108 in gaps (e.g., the lower voids 1004 and the upper voids 1006) after sacrificial material exhumation are known in the art and so are not described in detail herein.

Due to the improved structural integrity of the insulative structures 106 in the lower tier portion 120, due to the previous recessing of the sacrificial structures 206 (FIG. 6) and the previous formation of the insulative extensions 122 (FIG. 7), bending, collapsing, sagging, or other structural degradations of the insulative structures 106 of the lower tier portion 120 may be prevented. That is, the insulative structure 106 that would have been most prone to bending, collapsing, sagging, or other structural degradations—in the absence of the recessing and insulative extensions 122 formation—may be more structurally sound than they otherwise would have been. Accordingly, the gaps between the insulative structures 106 of the lower tier portion 120 (e.g., the lower voids 1004 (FIG. 10)) may be more reliably open and accessible to the formation therein of the conductive material(s) of the conductive structures 108.

The slits 902 remain, after forming the conductive material(s) of the conductive structures 108, either by forming the conductive material(s) to fill only the gaps (e.g., the lower voids 1004 and the upper voids 1006 (FIG. 10)) without extending further into the slits 902 or by overfilling the gaps and then performing another material-removal (e.g., etching) stage to re-form the slits 902. The slits 902 may then be filled by forming fill material(s) (e.g., a polysilicon material) within the slits 902 to form the fill material structures 130 as illustrated in FIG. 1, forming the microelectronic device structure (e.g., the microelectronic device structure 100 of FIG. 1).

Accordingly, disclosed is a method of forming a microelectronic device. The method comprises forming a stack structure comprising a vertically alternating sequence of insulative structures and sacrificial structures arranged in tiers. At least one opening, extending through the stack structure, is formed. A liner is formed within a portion of the at least one opening, the portion being above a lower tier portion of the stack structure. In the lower tier portion of the stack structure, the sacrificial structures are recessed to form recesses along the at least one opening. An insulative material is formed within the at least one opening and the recesses. At least one conductive contact structure is formed, directly adjacent the insulative material, to fill a remaining portion of the at least one opening. The sacrificial structures are replaced with conductive structures.

While the method illustrated in FIG. 2 through FIG. 11 and FIG. 1 includes forming the liner 128 (FIG. 4) before extending the openings (e.g., forming the extended openings 502 (FIG. 5)) through the lower tier portion 120, in other methods—such as that illustrated in FIG. 12 through FIG. 15—the liner 128 may be formed after forming the full-length openings. For example, with reference to FIG. 12, openings 1202 may be formed (e.g., etched), such as by using the hardmask 208 patterned to define opening dimensions PW, and the openings 1202 may be formed to fully extend through the height of the stack structure 202 and to or into the conductive base structure 112. The openings 1202 may taper in width due to practical limitations in the material-removal (e.g., etching) process.

Within the openings 1202, a liner 1302 is formed on the sidewalls that defined the openings 1202 above the lower tier portion 120, forming partially-lined openings 1304. For example, the liner 1302 may be formed of an oxide (e.g., deposited conformally by ALD, formed by a diffusion process) to a thickness of between about 4 nm and about 40 nm.

Figure 14:
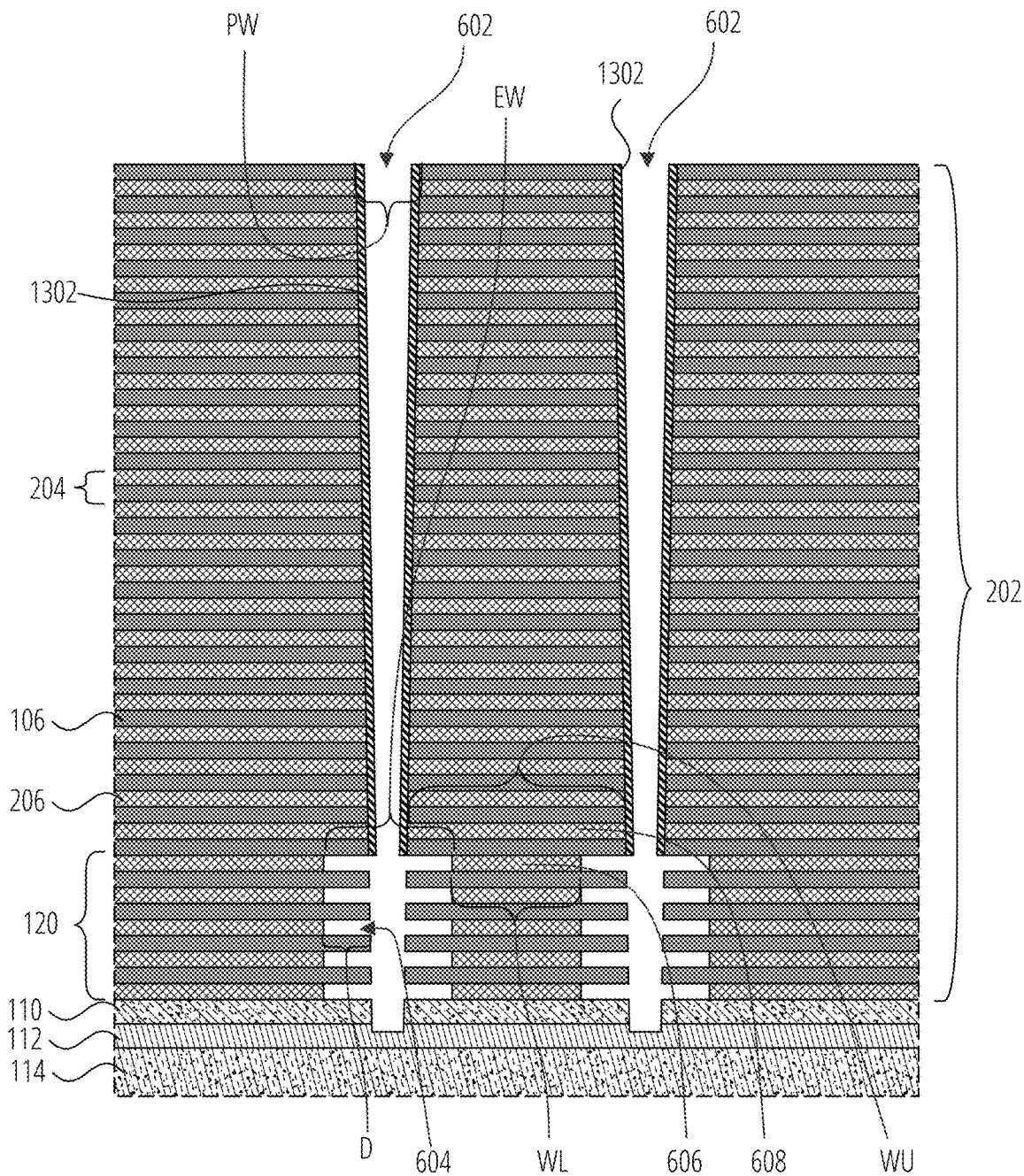

With reference to FIG. 14, the sacrificial structures 206 in the lower tier portion 120 portion may then be recessed in substantially the same manner described above with respect to FIG. 6.

Figure 15:
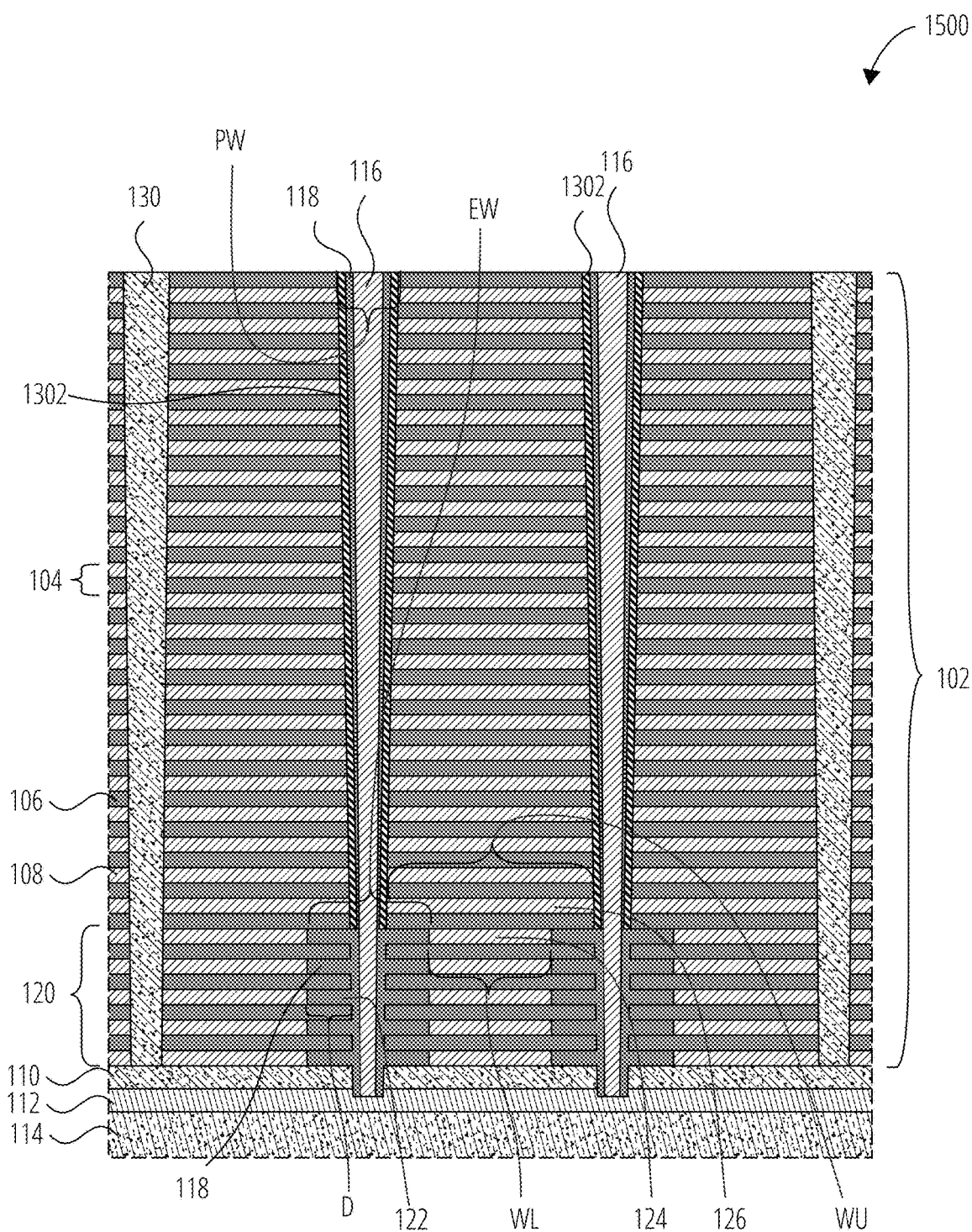

The fabrication process may proceed as described above, with respect to FIG. 7 through FIG. 11 and then FIG. 1, to form a microelectronic device structure 1500 of FIG. 15. The features of the microelectronic device structure 1500 are as described above with respect to FIG. 1, with the exception of the liner 1302 in place of the liner 128 (FIG. 1), and individual material or feature dimensions may vary from that illustrated in FIG. 1 to that illustrated in FIG. 15.

Figure 16:
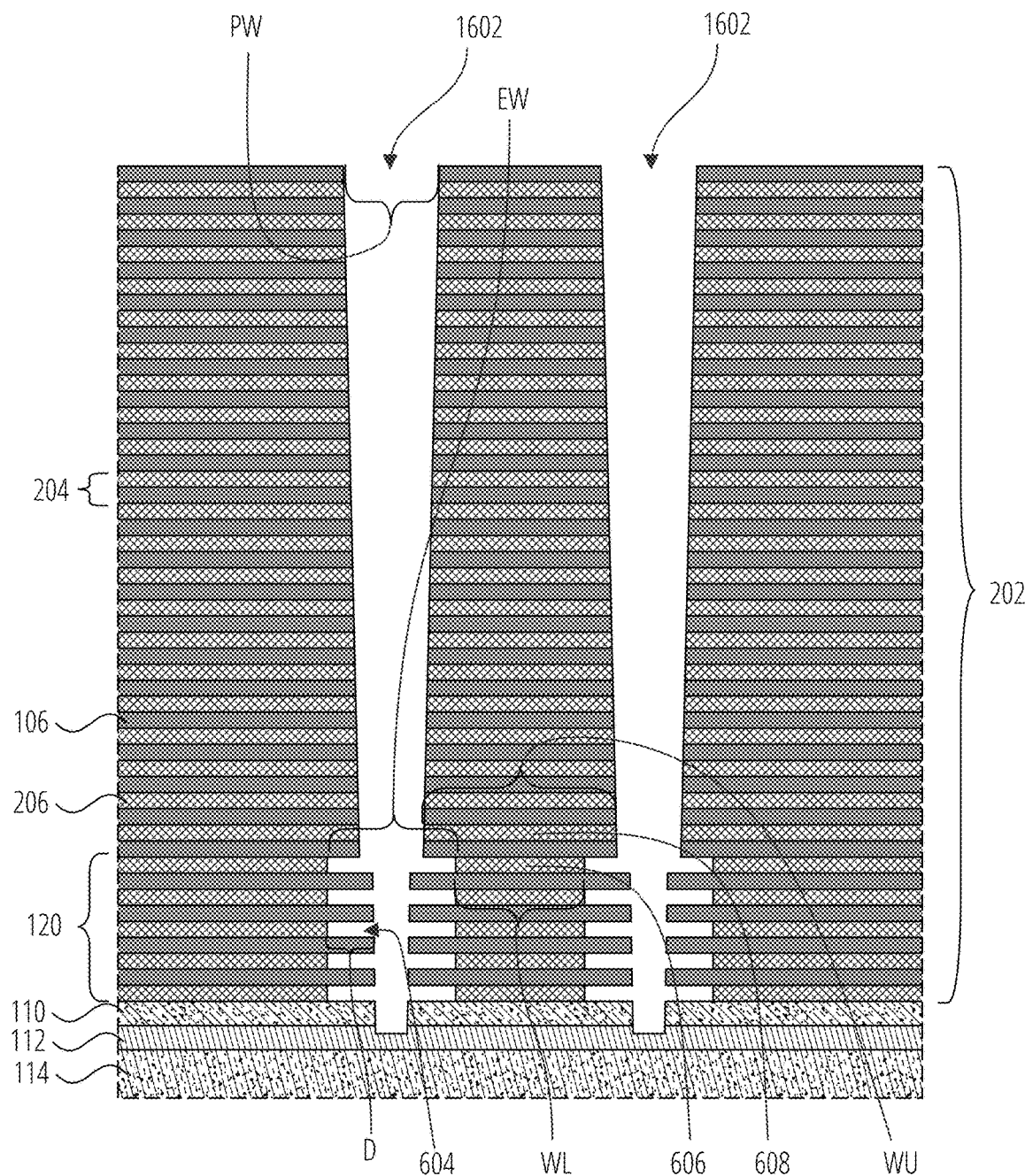
FIG. 16 through FIG. 18 are, in conjunction with FIG. 2 through FIG. 6, schematic illustrations during various stages of processing, wherein the stage of FIG. 16 follows that of FIG. 6, to fabricate the microelectronic device structure illustrated in FIG. 18, according to embodiments of the disclosure.
Figure 17:
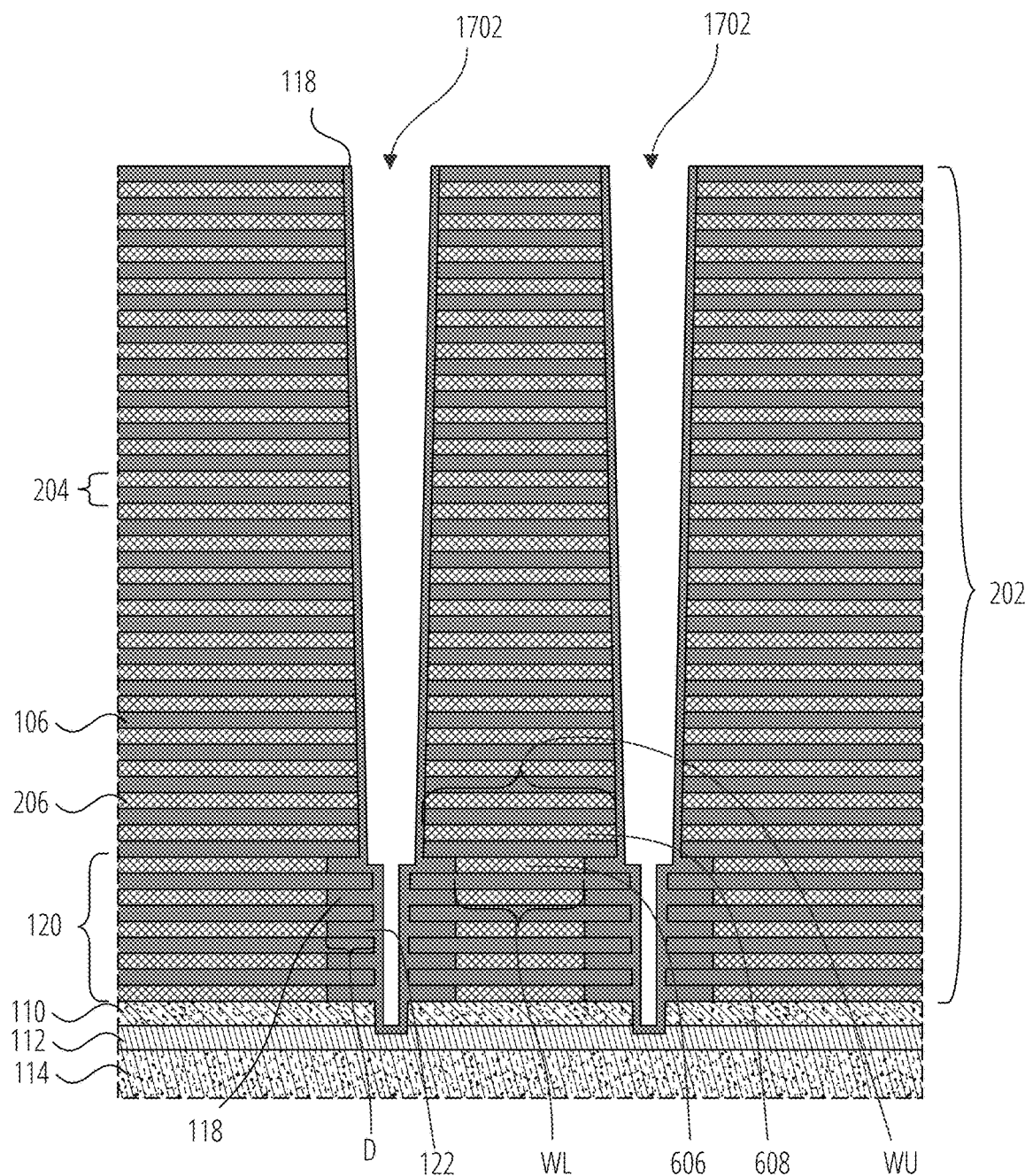
Figure 18:
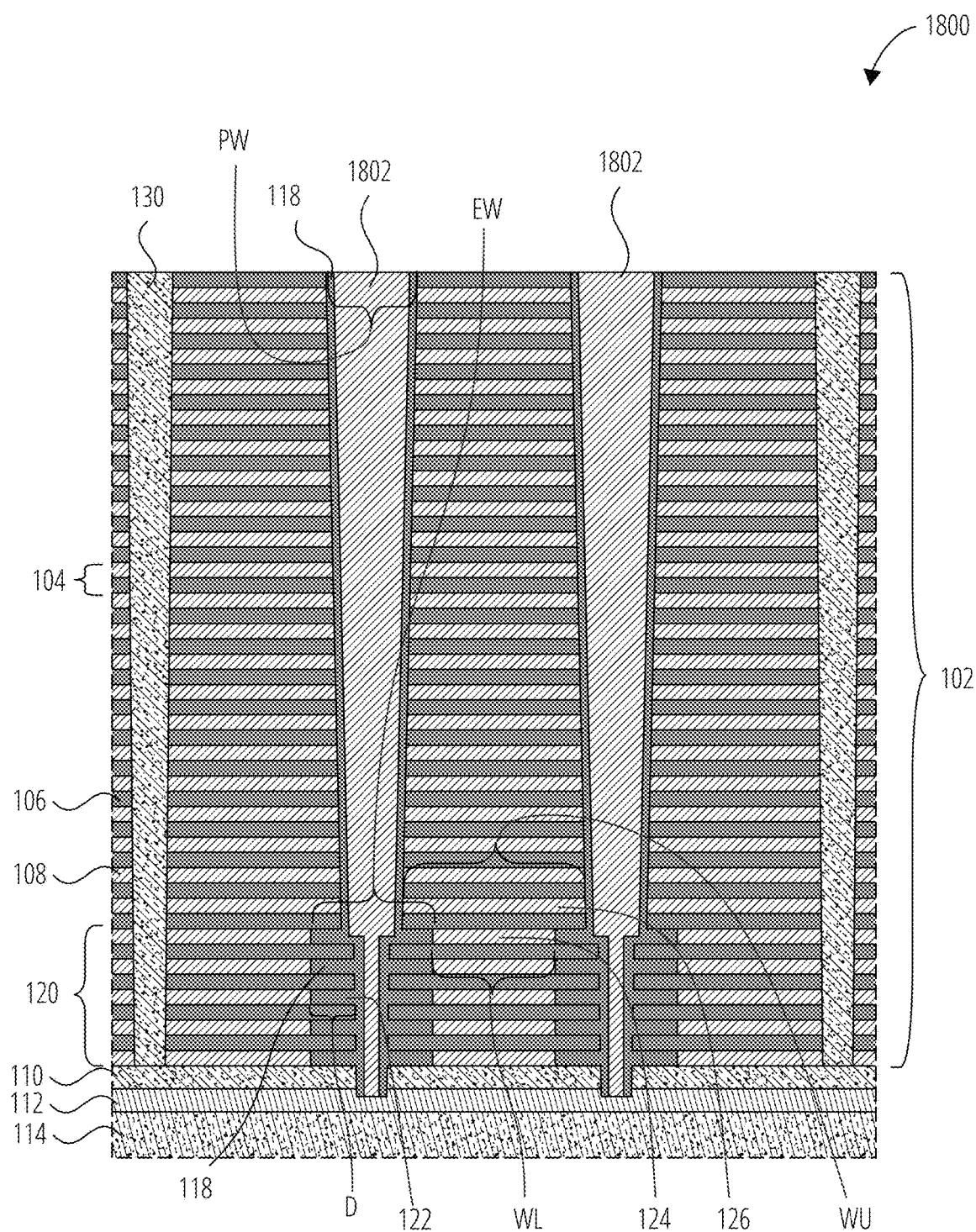

With reference to FIG. 16 through FIG. 18, illustrated are various stages in a method of fabricating a microelectronic device structure, the stages following that of FIG. 2 through FIG. 6, according to embodiments in which the liner 128 (FIG. 6) is sacrificial. More particularly, after recessing the sacrificial structures 206 in the lower tier portion 120 to form the lined base-widened openings 602 of FIG. 6, with the expanded widths EW, the liner 128 may be removed, forming the structure illustrated in FIG. 16 with base-widened openings 1602. Accordingly, the liner 128 may have been formed of and included sacrificial material, such as polysilicon.

With reference to FIG. 17, the insulative material 118 may then be formed (e.g., deposited) directly on the sidewalls of the insulative structures 106 and the sacrificial structures 206 of the tiers 204 of the stack structure 202. In the lower tier portion 120, the insulative material 118 fills the recesses 604 (FIG. 6). Because of the previous removal of the liner 128 (FIG. 6) that was formed before extending the openings into the lower tier portion 120 (e.g., before forming the extended openings 502 of FIG. 5), resulting openings 1702, lined with the insulative material 118, may taper in width from the top of the stack structure 202 to at least the lower tier portion 120 and then may more abruptly decrease to a width that continues or further tapers through the lower tier portion 120.

With reference to FIG. 18, base portions of the insulative material 118 may be removed (e.g., etched) to expose, in the openings 1702 (FIG. 17) a portion of the conductive base structure 112 before conductive material(s) is formed (e.g., deposited) in the openings 1702 to form a microelectronic device structure 1800 comprising contacts 1802. The conductive material(s) of the contacts 1802 may be formed of or include any of the aforementioned materials for the contacts 116 of FIG. 1. The contacts 1802 may taper in width through the stack structure 102 to at least the lower tier portion 120 and then may more abruptly decrease to a width that continues or further tapers through the lower tier portion 120.

Figure 12:
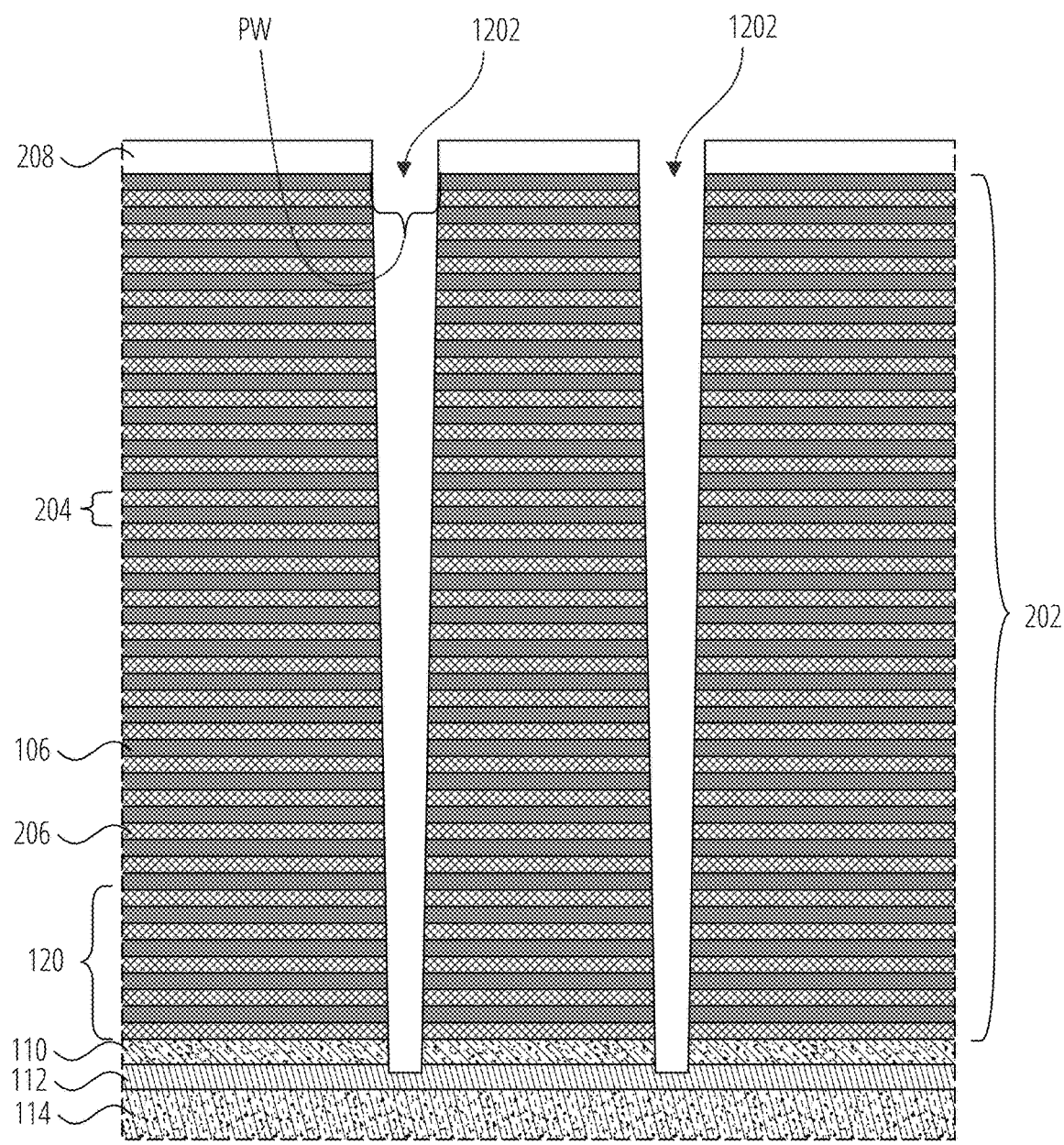
FIG. 12 through FIG. 15 are cross-sectional, elevational, schematic illustrations during various stages of processing to fabricate the microelectronic device structure illustrated in FIG. 15, according to embodiments of the disclosure.
Figure 13:
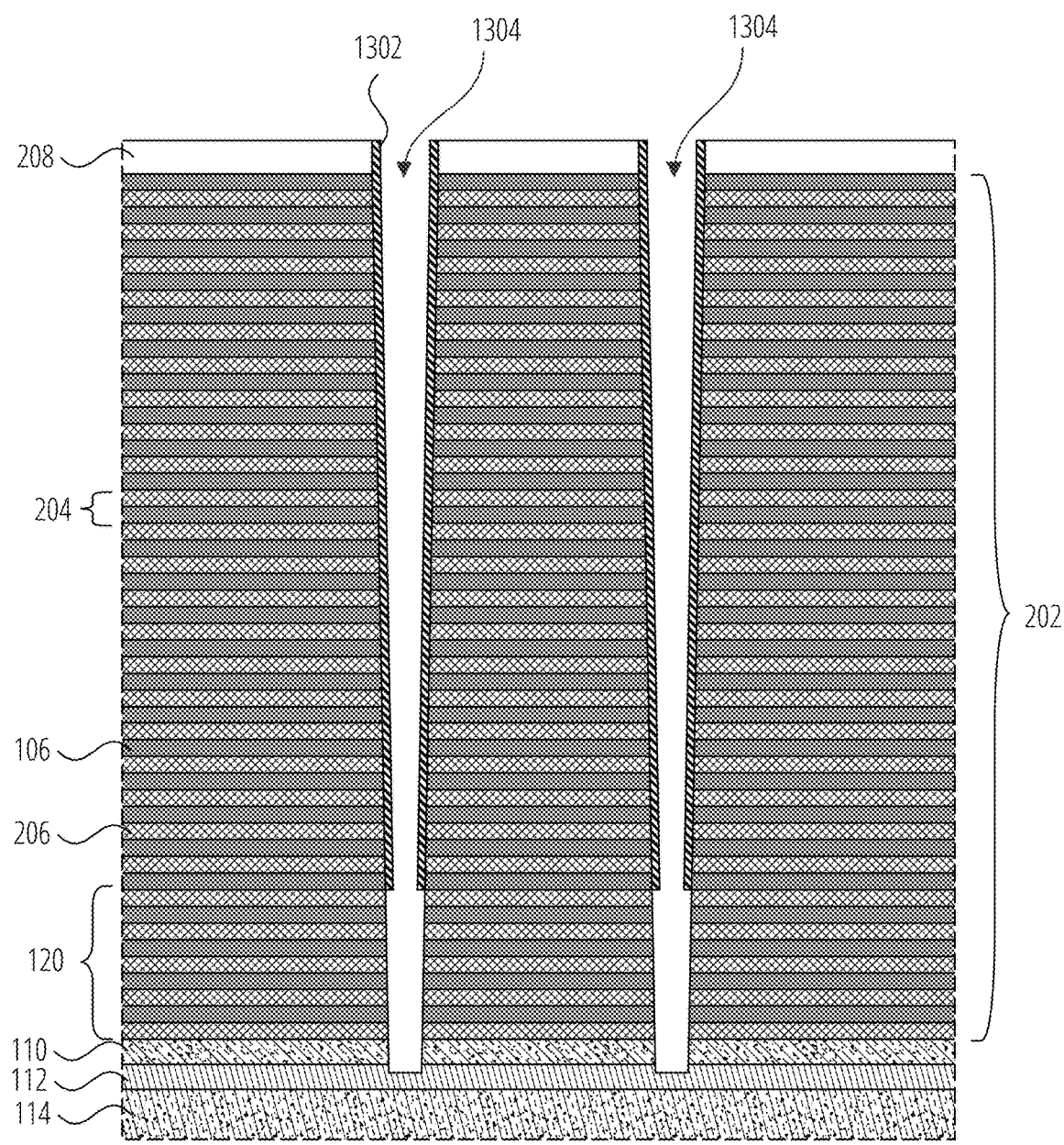
Figure 19:
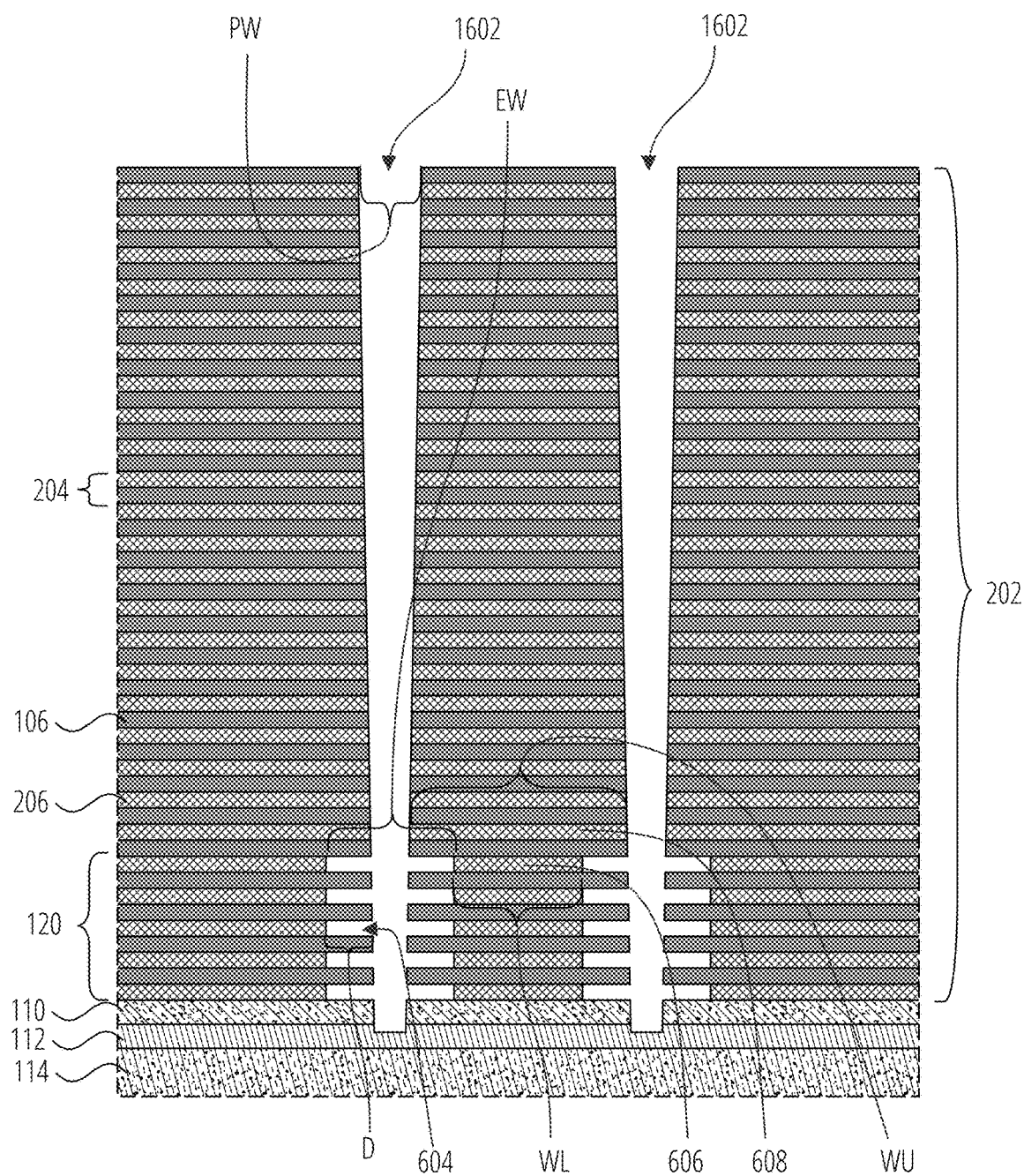
FIG. 19 and FIG. 20 are, in conjunction with FIG. 12 through FIG. 14, schematic illustrations during various stages of processing, wherein the stage of FIG. 19 follows that of FIG. 14, to fabricate the microelectronic device structure illustrated in FIG. 20, according to embodiments of the disclosure.
Figure 20:
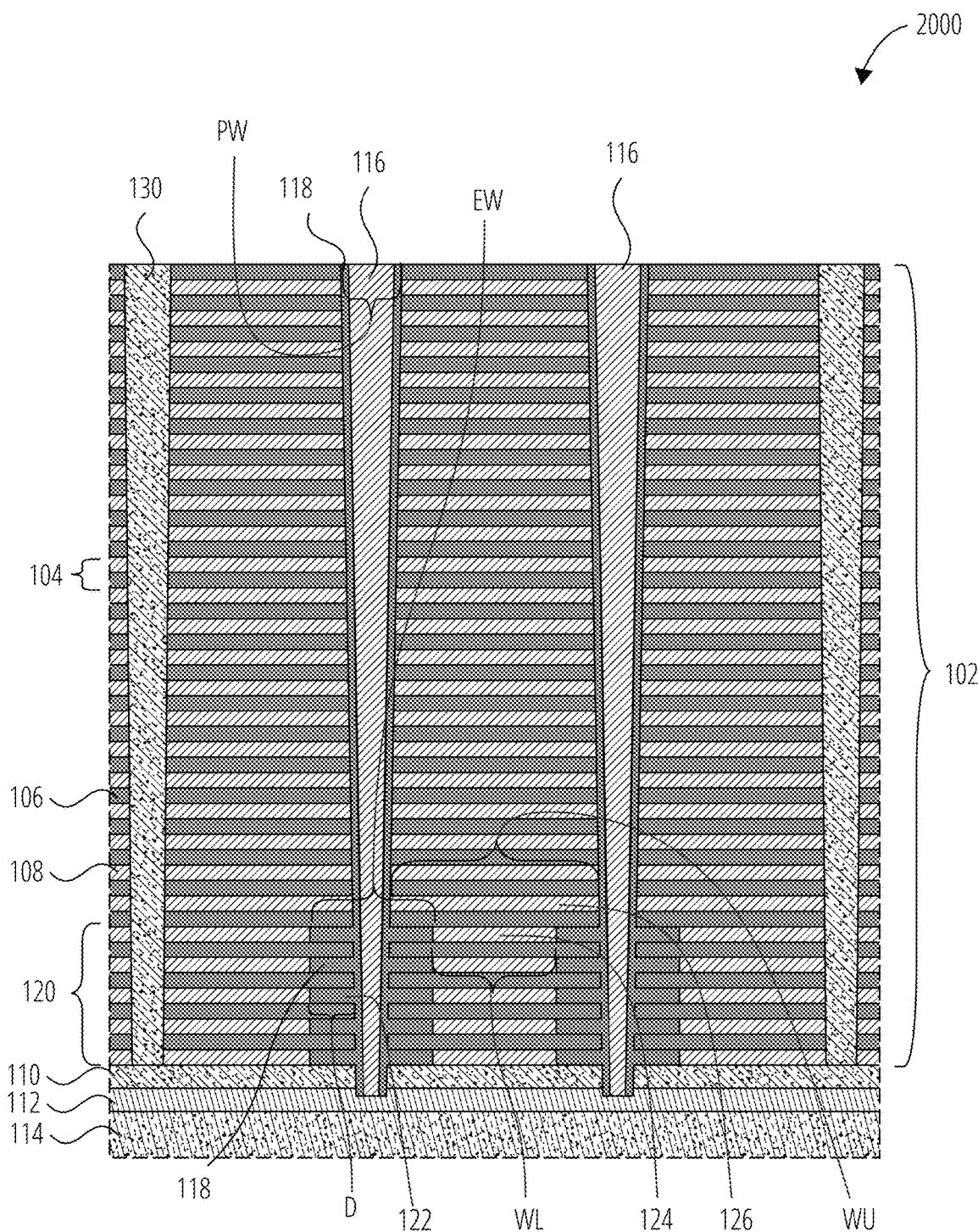

With reference to FIG. 19 and FIG. 20, illustrated are various stages in a method of fabricating a microelectronic device structure, the stages following that of FIG. 12 through FIG. 14, according to embodiments in which the liner 1302 (FIG. 14) is sacrificial. More particularly, after recessing the sacrificial structures 206 in the lower tier portion 120 to form the lined base-widened openings 602 of FIG. 14, with the expanded widths EW, the liner 1302 may be removed, forming the structure illustrated in FIG. 19 with base-widened openings 1602. Accordingly, the liner 1302 may have been formed of and included sacrificial material, such as polysilicon.

With reference to FIG. 20, the insulative material 118 may then be formed (e.g., deposited) directly on the sidewalls of the insulative structures 106 and the sacrificial structures 206 of the tiers 204 of the stack structure 202. In the lower tier portion 120, the insulative material 118 fills the recesses 604 (FIG. 14). Base portions of the insulative material 118 may be removed (e.g., etched) to expose a portion of the conductive base structure 112 before conductive material(s) is formed (e.g., deposited) to form a microelectronic device structure 2000 with the contacts 116. Because of the previous removal of the liner 1302 (FIG. 14) that was formed after forming openings extending fully through the stack structure 202, including through the lower tier portion 120 (e.g., after forming openings 1202 of FIG. 12), the resulting contacts 116 may taper in width from the top of the stack structure 102 to, e.g., the conductive base structure 112.

Figure 21:
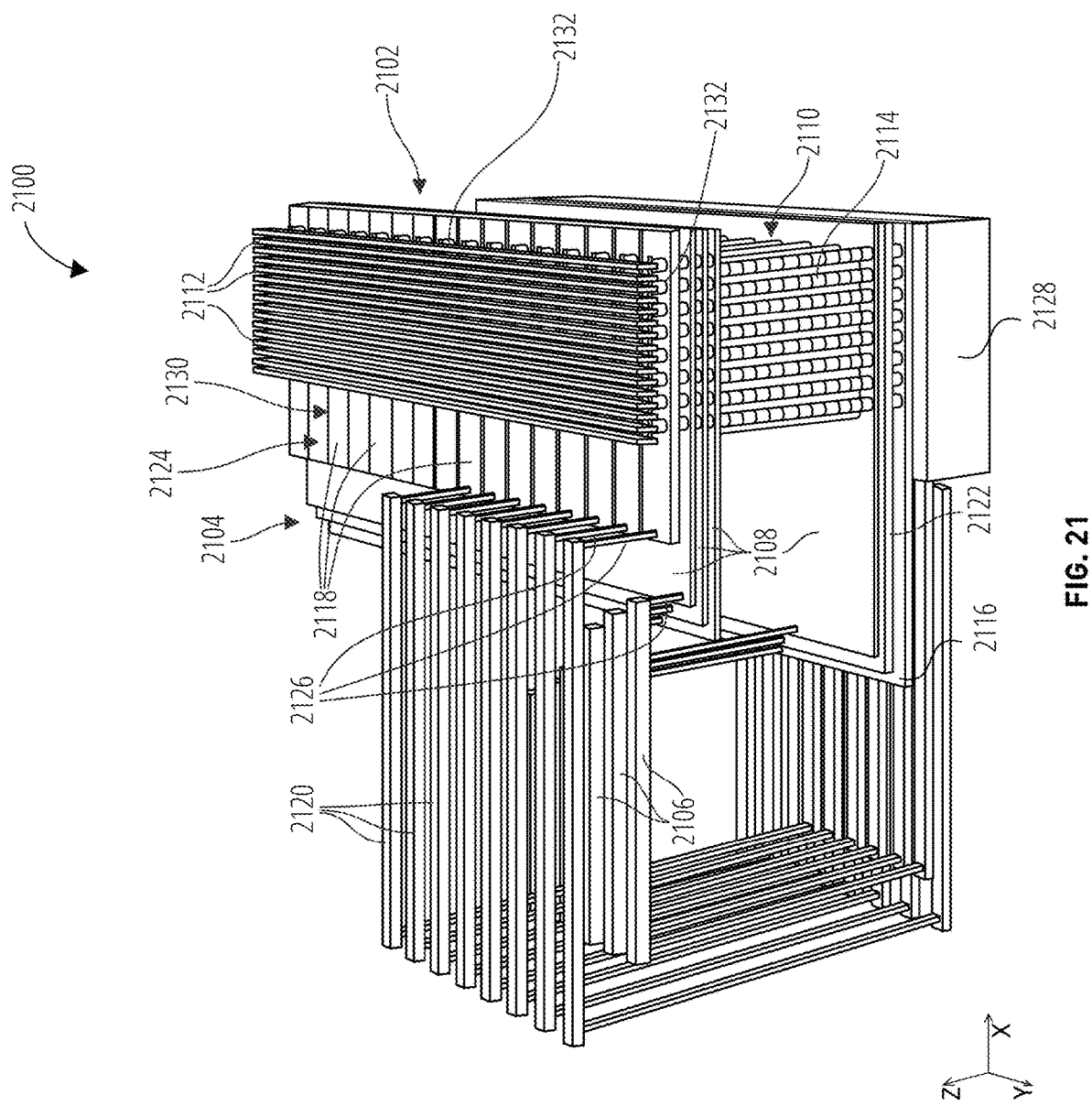
FIG. 21 is a partial, cutaway, perspective, schematic illustration of a microelectronic device, in accordance with embodiments of the disclosure.

FIG. 21 illustrates a partial cutaway, perspective, schematic illustration of a portion of a microelectronic device 2100 (e.g., a memory device, such as a 3D NAND Flash memory device) including a microelectronic device structure 2102. The microelectronic device structure 2102 may be substantially similar to the microelectronic device structure 100 of FIG. 1, the microelectronic device structure 1500 of FIG. 15, the microelectronic device structure 1800 of FIG. 18, and/or the microelectronic device structure 2000 of FIG. 20. As illustrated in FIG. 21, the microelectronic device structure 2102 may include a staircase structure 2104 defining contact regions for connecting access lines 2106 to conductive tiers 2108 (e.g., conductive layers, conductive plates, such as the conductive structures 108 (FIG. 1, FIG. 15, FIG. 18, FIG. 20)). The microelectronic device structure 2102 may include vertical strings 2110 of memory cells 2114 that are coupled to each other in series. The vertical strings 2110 may extend vertically (e.g., in the Z-direction) and orthogonally relative to the conductive tiers 2108, to data lines 2112, to a source tier 2116 (e.g., the conductive base structure 112 (FIG. 1, FIG. 15, FIG. 18, FIG. 20) below the stack structure 102 (FIG. 1, FIG. 15, FIG. 18, FIG. 20)), to the access lines 2106, to first select gates 2118 (e.g., upper select gates, drain select gates (SGDs)), to select lines 2120, and to a second select gate 2122 (e.g., a lower select gate, a source select gate (SGS)). The first select gates 2118 may be horizontally divided (e.g., in the Y-direction) into multiple blocks 2124, horizontally separated (e.g., in the Y-direction) from one another by slits 2130 (e.g., slits 902 (FIG. 9) filled with the fill material structures 130 (FIG. 1, FIG. 15, FIG. 18, FIG. 20)).

Vertical conductive contacts 2126 (e.g., contacts 116 (FIG. 1, FIG. 15, FIG. 20), contacts 1802 (FIG. 18)) may electrically couple components to each other, as illustrated. For example, the select lines 2120 may be electrically coupled to the first select gates 2118 and the access lines 2106 may be electrically coupled to the conductive tiers 2108. The microelectronic device 2100 may also include a control unit 2128 positioned under the memory array, which may include at least one of string driver circuitry, pass gates, circuitry for selecting gates, circuitry for selecting conductive lines (e.g., the data lines 2112, the access lines 2106), circuitry for amplifying signals, and circuitry for sensing signals. The control unit 2128 may be electrically coupled to the data lines 2112, the source tier 2116, the access lines 2106, the first select gates 2118, and the second select gates 2122, for example. In some embodiments, the control unit 2128 includes CMOS (complementary metal-oxide-semiconductor) circuitry. In such embodiments, the control unit 2128 may be characterized as having a "CMOS under Array" ("CuA") configuration.

The first select gates 2118 may extend horizontally in a first direction (e.g., the X-direction) and may be coupled to respective first groups of vertical strings 2110 of memory cells 2114 at a first end (e.g., an upper end) of the vertical strings 2110. The second select gate 2122 may be formed in a substantially planar configuration and may be coupled to the vertical strings 2110 at a second, opposite end (e.g., a lower end) of the vertical strings 2110 of memory cells 2114.

The data lines 2112 (e.g., bit lines) may extend horizontally in a second direction (e.g., in the Y-direction) that is at an angle (e.g., perpendicular) to the first direction in which the first select gates 2118 extend. The data lines 2112 may be coupled to respective second groups of the vertical strings 2110 at the first end (e.g., the upper end) of the vertical strings 2110. A first group of vertical strings 2110 coupled to a respective first select gate 2118 may share a particular vertical string 2110 with a second group of vertical strings 2110 coupled to a respective data line 2112. Thus, a particular vertical string 2110 may be selected at an intersection of a particular first select gate 2118 and a particular data line 2112. Accordingly, the first select gates 2118 may be used for selecting memory cells 2114 of the vertical strings 2110 of memory cells 2114.

The conductive tiers 2108 (e.g., word line plates) may extend in respective horizontal planes. The conductive tiers 2108 may be stacked vertically, such that each conductive tier 2108 is coupled to all of the vertical strings 2110 of memory cells 2114, and the vertical strings 2110 of the memory cells 2114 extend vertically through the stack of conductive tiers 2108. The conductive tiers 2108 may be coupled to or may form control gates of the memory cells 2114 to which the conductive tiers 2108 are coupled. Each conductive tier 2108 may be coupled to one memory cell 2114 of a particular vertical string 2110 of memory cells 2114.

The first select gates 2118 and the second select gates 2122 may operate to select a particular vertical string 2110 of the memory cells 2114 between a particular data line 2112 and the source tier 2116. Thus, a particular memory cell 2114 may be selected and electrically coupled to a data line 2112 by operation of (e.g., by selecting) the appropriate first select gate 2118, second select gate 2122, and conductive tier 2108 that are coupled to the particular memory cell 2114.

The staircase structure 2104 may be configured to provide electrical connection between the access lines 2106 and the conductive tiers 2108 through the vertical conductive contacts 2126. In other words, a particular level of the conductive tiers 2108 may be selected via one of the access lines 2106 that is in electrical communication with a respective one of the conductive contacts 2126 in electrical communication with the particular conductive tier 2108.

The data lines 2112 may be electrically coupled to the vertical strings 2110 through conductive structures 2132.

Figure 22:
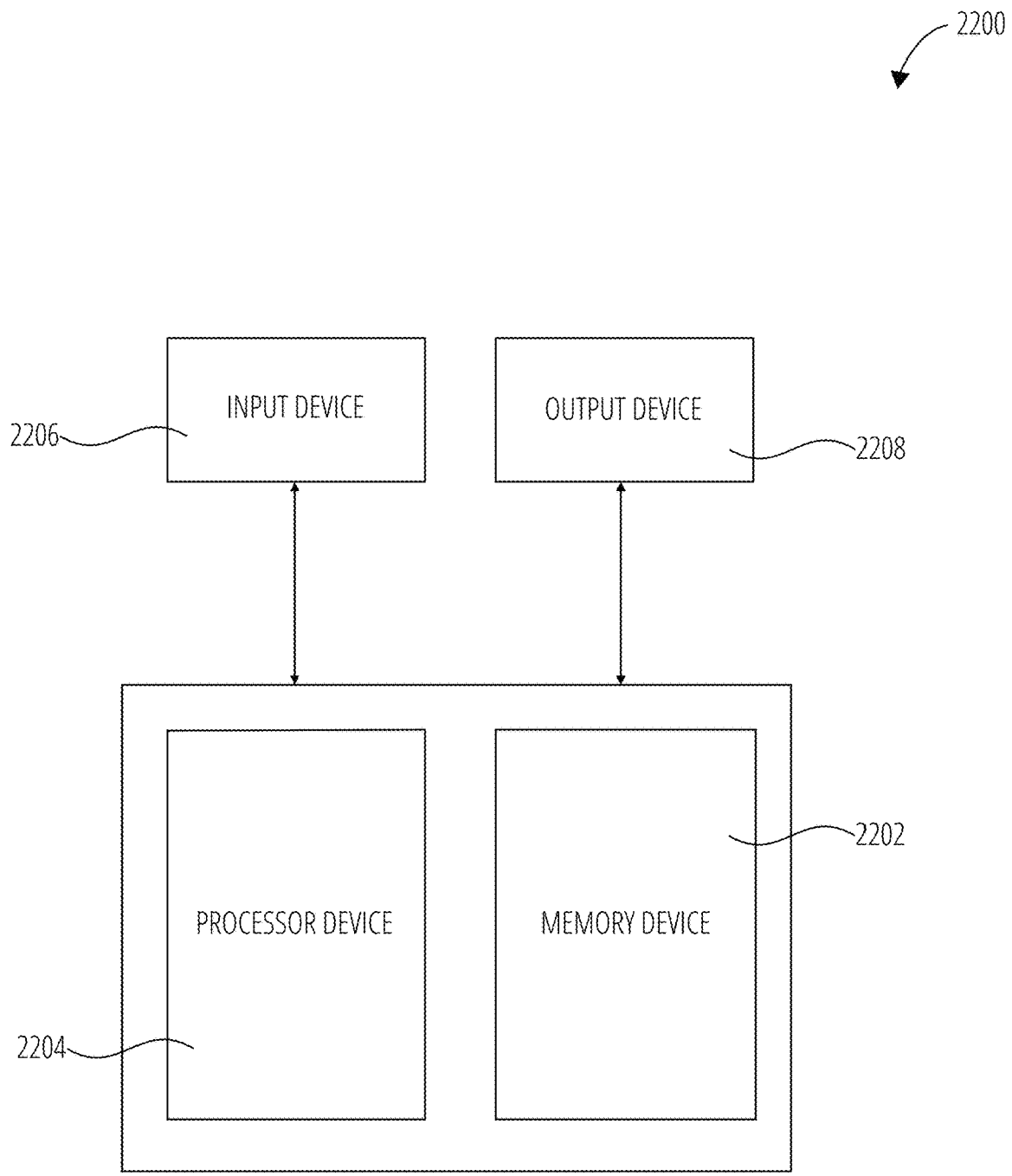
FIG. 22 is a block diagram of an electronic system, in accordance with embodiments of the disclosure.

Microelectronic devices (e.g., the microelectronic device 2100) including microelectronic device structures—such as the microelectronic device structure 100 of FIG. 1, the microelectronic device structure 1500 of FIG. 15, the microelectronic device structure 1800 of FIG. 18, and/or the microelectronic device structure 2000 of FIG. 20—may be used in embodiments of electronic systems of the disclosure. For example, FIG. 22 is a block diagram of an electronic system 2200, in accordance with embodiments of the disclosure. The electronic system 2200 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 2200 includes at least one memory device 2202. The memory device 2202 may include, for example, an embodiment of a microelectronic device and/or structure previously described herein (e.g., the microelectronic device structure 100 of FIG. 1, the microelectronic device structure 1500 of FIG. 15, the microelectronic device structure 1800 of FIG. 18, the microelectronic device structure 2000 of FIG. 20, the microelectronic device 2100 of FIG. 21), with structures formed according to methods of embodiments previously described herein.

The electronic system 2200 may further include at least one electronic signal processor device 2204 (often referred to as a "microprocessor"). The processor device 2204 may, optionally, include an embodiment of a microelectronic device and/or a microelectronic device structure previously described herein (e.g., one or more of the microelectronic device structure 100 of FIG. 1, the microelectronic device structure 1500 of FIG. 15, the microelectronic device structure 1800 of FIG. 18, the microelectronic device structure 2000 of FIG. 20, the microelectronic device 2100 of FIG. 21). The electronic system 2200 may further include one or more input devices 2206 for inputting information into the electronic system 2200 by a user, such as, for example, a mouse or other pointing device, a keyboard, a touchpad, a button, or a control panel. The electronic system 2200 may further include one or more output devices 2208 for outputting information (e.g., visual or audio output) to a user such as, for example, a monitor, a display, a printer, an audio output jack, a speaker, etc. In some embodiments, the input device 2206 and the output device 2208 may comprise a single touchscreen device that can be used both to input information into the electronic system 2200 and to output visual information to a user. The input device 2206 and the output device 2208 may communicate electrically with one or more of the memory device 2202 and the electronic signal processor device 2204.

With reference to FIG. 23, shown is a block diagram of a processor-based system 2300. The processor-based system 2300 may include various microelectronic devices (e.g., the microelectronic device 2100 of FIG. 21) and microelectronic device structures (e.g., the microelectronic device structure 100 of FIG. 1, the microelectronic device structure 1500 of FIG. 15, the microelectronic device structure 1800 of FIG. 18, the microelectronic device structure 2000 of FIG. 20) manufactured in accordance with embodiments of the present disclosure. The processor-based system 2300 may be any of a variety of types, such as a computer, a pager, a cellular phone, a personal organizer, a control circuit, or another electronic device. The processor-based system 2300 may include one or more processors 2302, such as a microprocessor, to control the processing of system functions and requests in the processor-based system 2300. The processor 2302 and other subcomponents of the processor-based system 2300 may include microelectronic devices (e.g., the microelectronic device 2100 of FIG. 21) and microelectronic device structures (e.g., the microelectronic device structure 100 of FIG. 1, the microelectronic device structure 1500 of FIG. 15, the microelectronic device structure 1800 of FIG. 18, the microelectronic device structure 2000 of FIG. 20) manufactured in accordance with embodiments of the present disclosure.

The processor-based system 2300 may include a power supply 2304 in operable communication with the processor 2302. For example, if the processor-based system 2300 is a portable system, the power supply 2304 may include one or more of a fuel cell, a power scavenging device, permanent batteries, replaceable batteries, and/or rechargeable batteries. The power supply 2304 may also include an AC adapter; therefore, the processor-based system 2300 may be plugged into a wall outlet, for example. The power supply 2304 may also include a DC adapter such that the processor-based system 2300 may be plugged into a vehicle cigarette lighter or a vehicle power port, for example.

Various other devices may be coupled to the processor 2302 depending on the functions that the processor-based system 2300 performs. For example, a user interface 2306 may be coupled to the processor 2302. The user interface 2306 may include one or more input devices, such as buttons, switches, a keyboard, a light pen, a mouse, a digitizer and stylus, a touch screen, a voice recognition system, a microphone, or a combination thereof. A display 2308 may also be coupled to the processor 2302. The display 2308 may include an LCD display, an SED display, a CRT display, a DLP display, a plasma display, an OLED display, an LED display, a three-dimensional projection, an audio display, or a combination thereof. Furthermore, an RF subsystem/baseband processor 2310 may also be coupled to the processor 2302. The RF subsystem/baseband processor 2310 may include an antenna that is coupled to an RF receiver and to an RF transmitter. A communication port 2312, or more than one communication port 2312, may also be coupled to the processor 2302. The communication port 2312 may be adapted to be coupled to one or more peripheral devices 2314 (e.g., a modem, a printer, a computer, a scanner, a camera) and/or to a network (e.g., a local area network (LAN), a remote area network, an intranet, or the Internet).

The processor 2302 may control the processor-based system 2300 by implementing software programs stored in the memory (e.g., system memory 2316). The software programs may include an operating system, database software, drafting software, word processing software, media editing software, and/or media-playing software, for example. The memory (e.g., the system memory 2316) is operably coupled to the processor 2302 to store and facilitate execution of various programs. For example, the processor 2302 may be coupled to system memory 2316, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 2316 may include volatile memory, nonvolatile memory, or a combination thereof. The system memory 2316 is typically large so it can store dynamically loaded applications and data. In some embodiments, the system memory 2316 may include semiconductor devices (e.g., the microelectronic device 2100 of FIG. 21) and structures (e.g., the microelectronic device structure 100 of FIG. 1, the microelectronic device structure 1500 of FIG. 15, the microelectronic device structure 1800 of FIG. 18, the microelectronic device structure 2000 of FIG. 20) described above, or a combination thereof.

The processor 2302 may also be coupled to nonvolatile memory 2318, which is not to suggest that system memory 2316 is necessarily volatile. The nonvolatile memory 2318 may include one or more of STT-MRAM, MRAM, read-only memory (ROM) (e.g., EPROM, resistive read-only memory (RROM)), and Flash memory to be used in conjunction with the system memory 2316. The size of the nonvolatile memory 2318 is typically selected to be just large enough to store any necessary operating system, application programs, and fixed data. Additionally, the nonvolatile memory 2318 may include a high-capacity memory (e.g., disk drive memory, such as a hybrid-drive including resistive memory or other types of nonvolatile solid-state memory, for example). The nonvolatile memory 2318 may include microelectronic devices (e.g., the microelectronic device 2100 of FIG. 21) and structures (e.g., the microelectronic device structure 100 of FIG. 1, the microelectronic device structure 1500 of FIG. 15, the microelectronic device structure 1800 of FIG. 18, the microelectronic device structure 2000 of FIG. 20) described above, or a combination thereof.

Accordingly, disclosed is an electronic system comprising an input device, an output device, a processor device, and a memory device. The processor device is operably coupled to the input device and to the output device. The memory device is operably coupled to the processor device. The memory device comprises at least one microelectronic device structure. The at least one microelectronic device structure comprises contacts extending through a stack structure of vertically alternating insulative structures and conductive structures arranged in tiers. The conductive structures comprise—in a lower tier portion of the stack structure—at least one lower conductive structure portion between a neighboring pair of the contacts. The conductive structures also comprise—in an additional portion of the stack structure above the lower tier portion—at least one upper conductive structure portion between the neighboring pair of the contacts. The at least one lower conductive structure portion has a narrower width than the at least one upper conductive structure portion.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
 a stack structure comprising a vertically alternating sequence of insulative structures and conductive structures arranged in tiers;
 conductive contact structures extending through the stack structure; and
 an insulative material between the conductive contact structures and the tiers of the stack structure,
 in a lower tier portion of the stack structure, a conductive structure, of the conductive structures, having a portion extending a first width between a pair of the conductive contact structures,
 in a portion of the stack structure above the lower tier portion, an additional conductive structure, of the conductive structures, having an additional portion extending a second width between the pair of the conductive contact structures, the second width being greater than the first width.

2. The microelectronic device of claim 1, wherein the conductive contact structures taper in width from a broadest width at a top of the stack structure to a narrowest width at or below a bottom of the stack structure.

3. The microelectronic device of claim 2, wherein:
 the insulative material tapers in width through the portion of the stack structure above the lower tier portion; and
 the insulative material, in the lower tier portion, extends laterally to define insulative extensions vertically adjacent ends of the insulative structures of the lower tier portion.

4. The microelectronic device of claim 1, wherein the conductive structures of the lower tier portion of the stack structure are laterally recessed relative to the insulative structures of the lower tier portion of the stack structure.

5. The microelectronic device of claim 1, further comprising a liner between the insulative material and the tiers of the stack structure in the portion of the stack structure above the lower tier portion.

6. The microelectronic device of claim 5, wherein the liner comprises an oxide material.

7. The microelectronic device of claim 1, wherein the insulative material is directly adjacent the conductive contact structures and ends of the tiers of the stack structure.

8. The microelectronic device of claim 1, wherein an outer diameter of the insulative material at an elevation of an uppermost of the conductive structures of the lower tier portion of the stack structure is greater than an outer diameter of the insulative material at an elevation of an uppermost of the conductive structures of the stack structure.

9. The microelectronic device of claim 8, wherein the outer diameter of the insulative material at the elevation of the uppermost of the conductive structures of the lower tier portion is at least about 100 nm.

10. The microelectronic device of claim 1, wherein the lower tier portion comprises at about 5% to about 20% of a total quantity of the tiers present in the stack structure.

11. The microelectronic device of claim 1, further comprising:
 an additional insulative material adjacent the conductive contact structures and extending through the stack structure, the additional insulative material including insulative extensions partially horizontally extending across and vertically alternating with the insulative structures within the lower tier portion of the stack structure.

12. The microelectronic device of claim 11, wherein, above the lower tier portion of the stack structure, the additional insulative material does not include the insulative extensions.

13. The microelectronic device of claim 1, wherein the conductive structures in the lower tier portion are laterally recessed relative to the additional conductive structure in the portion of the stack structure above the lower tier portion.

14. The microelectronic device of claim 1, wherein the lower tier portion of the stack structure comprises from about ten to about forty of the tiers.

15. An electronic system, comprising:
 an input device;
 an output device;
 a processor device operably coupled to the input device and to the output device; and
 a memory device operably coupled to the processor device and comprising at least one microelectronic device structure, the at least one microelectronic device structure comprising contacts extending through a stack structure of vertically alternating insulative structures and conductive structures arranged in tiers, the conductive structures comprising:
  in a lower tier portion of the stack structure, at least one lower conductive structure portion between a neighboring pair of the contacts; and
  in an additional portion of the stack structure above the lower tier portion, at least one upper conductive structure portion between the neighboring pair of the contacts,
  the at least one lower conductive structure portion having a narrower width than the at least one upper conductive structure portion.

16. The electronic system of claim 15, wherein the at least one microelectronic device structure further comprises an insulative material between the contacts and tiers of the stack structure, the insulative material including insulative extensions adjacent a base of the contacts, the insulative extensions vertically alternating with ends of the insulative structures in the lower tier portion of the stack structure.

* * * * *